(12) United States Patent
Kikuchi et al.

(10) Patent No.: US 7,592,656 B2
(45) Date of Patent: Sep. 22, 2009

(54) SEMICONDUCTOR DEVICE AND FABRICATING METHOD OF THE SAME

(75) Inventors: Hideaki Kikuchi, Kawasaki (JP); Kouichi Nagai, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 104 days.

(21) Appl. No.: 11/191,967

(22) Filed: Jul. 29, 2005

(65) Prior Publication Data

US 2006/0223198 A1    Oct. 5, 2006

(30) Foreign Application Priority Data

Mar. 30, 2005   (JP) ............................. 2005-099010

(51) Int. Cl.
*H01L 27/108*   (2006.01)
*H01L 29/94*    (2006.01)

(52) U.S. Cl. ............................. 257/295; 257/296; 438/2

(58) Field of Classification Search ................ 257/295, 257/758, E27.104, E29.164, E29.272, E21.436, 257/E21.664, 310, 640, 296, 532; 438/3, 438/622

See application file for complete search history.

(56) References Cited

U.S. PATENT DOCUMENTS

| | | | |
|---|---|---|---|
| 6,635,528 B2 * | 10/2003 | Gilbert et al. | 438/253 |
| 6,713,342 B2 * | 3/2004 | Celii et al. | 438/239 |
| 6,953,950 B2 | 10/2005 | Sashida | |
| 6,982,448 B2 * | 1/2006 | Udayakumar et al. | 257/295 |
| 6,984,857 B2 * | 1/2006 | Udayakumar et al. | 257/295 |
| 7,019,352 B2 * | 3/2006 | Udayakumar et al. | 257/310 |
| 7,029,925 B2 * | 4/2006 | Celii et al. | 438/3 |
| 7,285,460 B2 | 10/2007 | Sashida | |
| 2003/0030084 A1 | 2/2003 | Moise et al. | |
| 2004/0046185 A1 | 3/2004 | Sashida | |

(Continued)

FOREIGN PATENT DOCUMENTS

JP    2003-273328 A    9/2003
JP    2004-95861 A     3/2004

OTHER PUBLICATIONS

Patent Abstracts of Japan, Publication No. 2001068639, dated Mar. 16, 2001.

(Continued)

*Primary Examiner*—S. V Clark
(74) *Attorney, Agent, or Firm*—Westerman, Hattori, Daniels & Adrian, LLP.

(57) ABSTRACT

An $Al_2O_3$ film with a thickness greater than that of a wiring is formed as a protective film, and then the $Al_2O_3$ film is polished by CMP until a conductive barrier film is exposed. Namely, CMP is applied to the $Al_2O_3$ film by utilizing the conductive barrier film as a stopper film. Next, a silicon oxide film is formed over the entire surface by, for example, a high-density plasma method, and then the surface thereof is flattened. Subsequently, another $Al_2O_3$ film is formed on the silicon oxide film as a protective film for preventing intrusion of hydrogen or moisture. Further, another silicon oxide film is formed on the $Al_2O_3$ film, for example, by a high-density plasma method. Then, a via hole reaching the conductive barrier film is formed through the silicon oxide film, the $Al_2O_3$ film and the silicon oxide film, and then a W plug is embedded therein.

16 Claims, 29 Drawing Sheets

U.S. PATENT DOCUMENTS

| | | |
|---|---|---|
| 2005/0032301 A1 | 2/2005 | Udayakumar et al. |
| 2006/0001026 A1 | 1/2006 | Sashida |
| 2008/0054402 A1 | 3/2008 | Sashida |

OTHER PUBLICATIONS

Patent Abstracts of Japan, Publication No. 2002176149, dated Jun. 21, 2002.
Patent Abstracts of Japan, Publication No. 2003100994, dated Apr. 4, 2003.
Patent Abstracts of Japan, Publication No. 2003174145, dated Jun. 20, 2003.
Patent Abstracts of Japan, Publication No. 2003197878, dated Jul. 11, 2003.
Patent Abstracts of Japan, Publication No. 2003289074, dated Oct. 10, 2003.
Korean Office Action KR 10-2005-0067182 dated Oct. 23, 2006.
Chinese Office Action dated Apr. 4, 2008 issued in corresponding Application No. 200510092679.2.
Japanese Office Action dated Sep. 9, 2008 issued in corresponding Application No. 2005-099010.

* cited by examiner

SEMICONDUCTOR DEVICE AND FABRICATING METHOD OF THE SAME

CROSS-REFERENCE TO RELATED APPLICATIONS

This application is based upon and claims the benefit of priority from the prior Japanese Patent Application No. 2005-099010, filed on Mar. 30, 2005, the entire contents of which are incorporated herein by reference.

BACKGROUND OF THE INVENTION

1. Field of the Invention

The present invention relates to semiconductor devices suitable for ferroelectric memories and the fabricating methods of the same.

2. Description of the Related Art

In recent years, attentions have been focused on utilization of a ferroelectric film as a dielectric film of a capacitor. The capacitor is referred to as a ferroelectric capacitor, and a ferroelectric memory (FeRAM: Ferro-electric Random Access Memory) including the ferroelectric capacitor is a nonvolatile memory. The ferroelectric memory has advantages such as the capability of high-speed operations, low electric power consumption, excellent writing/reading durability and, therefore, it is expected to be further advanced in the future.

However, the ferroelectric capacitor has the characteristics of being prone to degradation of characteristics due to hydrogen gas and moisture from outside. For example, it is known that, in the case where a ferroelectric capacitor is constituted by a bottom electrode made from a Pt film, a ferroelectric film made from a $PbZr_{1-x}Ti_xO_3$ film (PZT film) and a top electrode made from a Pt film which are laminated in order, when a substrate thereof is heated to a temperature of about 200° C. in an atmosphere of hydrogen partial pressure of about 40 Pa (0.3 Torr), the PZT film loses most of its ferroelectric characteristics. Further, it is known that, when heat treatment is applied to a ferroelectric capacitor which has absorbed moisture or exists near moisture, the ferroelectricity of the ferroelectric film of the ferroelectric capacitor is significantly degraded.

Because of such characteristics of the ferroelectric capacitor, low-temperature processes capable of suppressing generation of moisture to a maximum extent are selected as processes after the formation of the ferroelectric film, in the fabrication processes for a ferroelectric memory. Further, as the process for depositing an interlayer insulation film, a deposition process with a CVD (chemical vapor deposition) method or the like, using material gases which generate relatively little hydrogen is selected. Further, as techniques for preventing degradation of a ferroelectric film due to hydrogen and moisture, there have been suggested techniques which form an aluminum oxide film over the ferroelectric capacitor and techniques which form an aluminum oxide film on an interlayer insulation film formed on the ferroelectric capacitor and the like. This is because the aluminum oxide film has a function of preventing diffusion of hydrogen and moisture. Therefore, these techniques can prevent hydrogen and moisture from reaching the ferroelectric films, thus preventing degradation of the ferroelectric films due to hydrogen and moisture.

These techniques are described, for example, in Patent Documents 1 to 5.

After the formation of a ferroelectric capacitor, Al wirings are formed and further an oxide film is formed as an interlayer insulation film by a plasma CVD method or the like. During the formation of the oxide film, the ferroelectric capacitor may be also degraded. Therefore, before the formation of the interlayer insulation film, an aluminum oxide film covering the Al wirings is formed.

However, the aluminum oxide film is difficult to etch. In order to ensure conduction between a wiring formed above and the Al wiring, it is necessary to etch the aluminum oxide film to form a via hole. However, such a process is difficult. Consequently, the diameter of the via hole may become smaller than a designed value, or a tungsten plug to be formed as a via plug may become abnormal due to influences of deposited substances during etching, thereby resulting in poor contact. This reduces the design margin, increases the difficulty of providing stable characteristics, and reduces the yield. Therefore, currently, the total thickness of the aluminum oxide film is set to 70 nm or less.

[Patent Document 1] Japanese Patent Application Laid-open No. 2003-197878

[Patent Document 2] Japanese Patent Application Laid-open No. 2001-68639

[Patent Document 3] Japanese Patent Application Laid-open No. 2003-174145

[Patent Document 4] Japanese Patent Application Laid-open No. 2002-176149

[Patent Document 5] Japanese Patent Application Laid-open No. 2003-100994

[Patent Document 6] Japanese Patent Application Laid-open No. 2003-289074

SUMMARY OF THE INVENTION

It is an object of the invention to provide semiconductor devices and the fabricating methods thereof which can provide stable characteristics while preventing damages of ferroelectric capacitors.

The present inventors have earnestly conducted studies for overcoming the aforementioned problems and, as a result, reached the following respective aspects of the invention.

A first semiconductor device according to the present invention comprises a ferroelectric capacitor having an electrode and an insulation film suppressing intrusion of hydrogen or moisture into said ferroelectric capacitor. The insulation film includes a gap in which a wiring connected to the electrode of said ferroelectric capacitor is formed. The first semiconductor further comprises wiring layer including a wiring formed in the gap in said insulation film and connected to the electrode of said ferroelectric capacitor. The surface of the wiring is exposed from said insulation film. In the case where the insulation film for suppressing intrusion of hydrogen and moisture in the gap between the wirings is formed after a CMP process, its surface is significantly flat.

A second semiconductor device according to the present invention comprises a ferroelectric capacitor having a top electrode, and an insulation film suppressing intrusion of hydrogen or moisture into said ferroelectric capacitor. The insulation film is formed below the surface of the top electrode, and the surface of the top electrode is exposed from said insulation film. In the case where the insulation film for suppressing intrusion of hydrogen and moisture at a position below the surface of the top electrode is formed after a CMP process, its surface is significantly flat.

In a first fabricating method of a semiconductor device according to the present invention, a ferroelectric capacitor having an electrode is formed and then a wiring layer including a wiring connected directly to the electrode of the ferroelectric capacitor is formed. When the wiring layer is formed, an insulation film suppressing intrusion of hydrogen or moisture into the ferroelectric capacitor is formed in a gap of the wiring such that the surface of the wiring is exposed. In the case where the insulation film for suppressing intrusion of hydrogen and moisture in the gap between the wirings is formed after a CMP process, its surface is significantly flat.

In a second fabricating method of a semiconductor device according to the present invention, a ferroelectric capacitor having a top electrode is formed and then an insulation film suppressing intrusion of hydrogen or moisture into the ferroelectric capacitor, below the surface of the top electrode, such that the surface of the top electrode is exposed. In the case where the insulation film for suppressing intrusion of hydrogen and moisture at a position below the surface of the top electrode is formed after a CMP process, its surface is significantly flat.

It is preferable that two or more insulation films are formed from either insulation films for suppressing intrusion of moisture formed below the top electrode, or insulation films for suppressing intrusion of moisture formed in the gap of the wiring layer, or a combination thereof.

It is also preferable that the insulation film for suppressing intrusion of moisture is placed over a logic circuit section, a pad section, a scribe section between chips, as well as over the ferroelectric memory section.

DETAILED DESCRIPTION OF THE PREFERRED EMBODIMENTS

Figure 1:
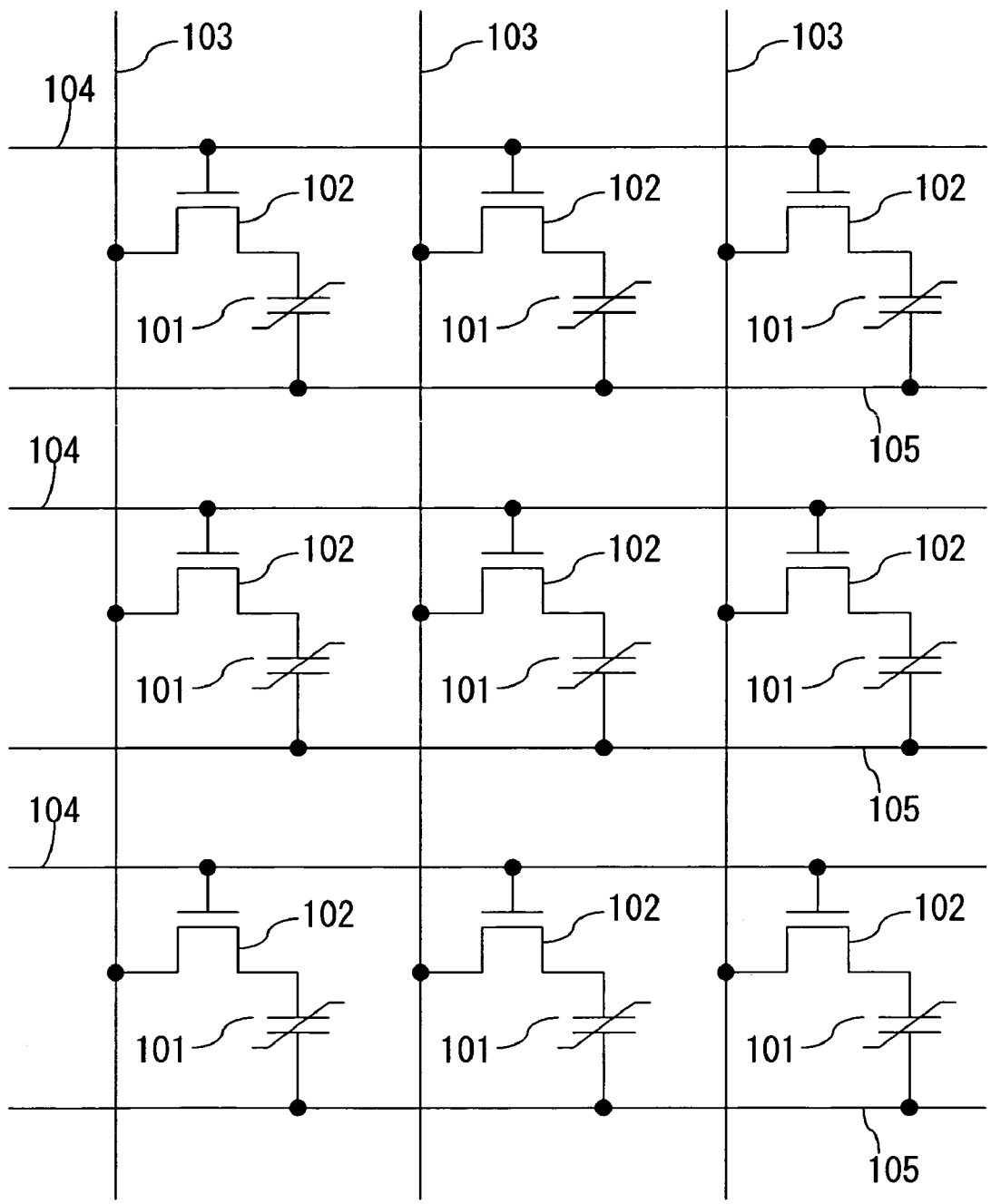
FIG. 1 is a circuit diagram illustrating a structure of a memory cell array of a ferroelectric memory fabricated by a method according to an embodiment of the present invention.

Hereinafter, embodiments of the present invention will be described with reference to the drawings. FIG. 1 is a circuit diagram illustrating the structure of a memory cell array in a ferroelectric memory (semiconductor device) fabricated with a method according to the embodiments of the present invention.

The memory cell array includes a plurality of bit lines 103 extending in a single direction, a plurality of word lines 104 and plate lines 105 extending in the direction perpendicular to the direction of extension of-the bit lines 103. In alignment with the lattices formed by the bit lines 103, the word lines 104 and the plate lines 105, a plurality of memory cells of the ferroelectric memory are placed in an array shape. Each of the memory cells is provided with a ferroelectric capacitor (storage portion) 101 and a MOS transistor (switching portion) 102.

A gate of the MOS transistor 102 is connected to the word lines 104. Further, one of the source and drain of the MOS transistors 102 is connected to the bit line 103 and the other of the source and drain of the MOS transistors 102 is connected to one of the electrodes of the ferroelectric capacitor 101. Further, the other electrode of the ferroelectric capacitor 101 is connected to the plate line 105. Further, the respective word lines 104 and the respective plate lines 105 are shared by the plurality of MOS transistors 102 arranged in the same direction as the direction of extension thereof. Similarly, the respective bit lines 103 are shared by the plurality of MOS transistors 102 arranged in the same direction as the direction of extension thereof. The direction of extension of the word lines 104 and the plate lines 105 and the direction of extension of the bit lines 103 may be referred to as row and column directions, respectively. However, the placement of the bit lines 103, the word lines 104 and the plate lines 105 are not limited to that which has been previously described.

The memory cell array of the ferroelectric memory configured as described above stores data in accordance with the polarization of ferroelectric films provided in the ferroelectric capacitors 101.

First Embodiment

Next, the first embodiment of the present invention will be described. Here, for convenience, the cross sectional structure of a semiconductor device will be described along with the fabrication method of the same. FIGS. 2A to 2H are cross sectional views illustrating a method for fabricating a ferroelectric memory (semiconductor device) according to the first embodiment of the present invention, in the order of processes.

According to the present invention, a semiconductor device as follows is fabricated. Namely, as illustrated in FIG. 11, the semiconductor device includes, in order from left to right, a scribe section 201, a scribe section—PAD section boundary section 202, a PAD section 203, a PAD section—circuit section boundary section 204, a logic circuit section 205, a circuit—circuit boundary section 206, a FeRAM section (ferroelectric capacitor section) 207, a PAD section—circuit section boundary section 208, a PAD section 209, a scribe section—PAD section boundary section 210 and a scribe section 211.

Hereinafter, the regions other than the FeRAM section 207 can be represented by the fabrication method of the FeRAM section 207 and description of the fabricating method of these regions will be omitted.

Figure 12:
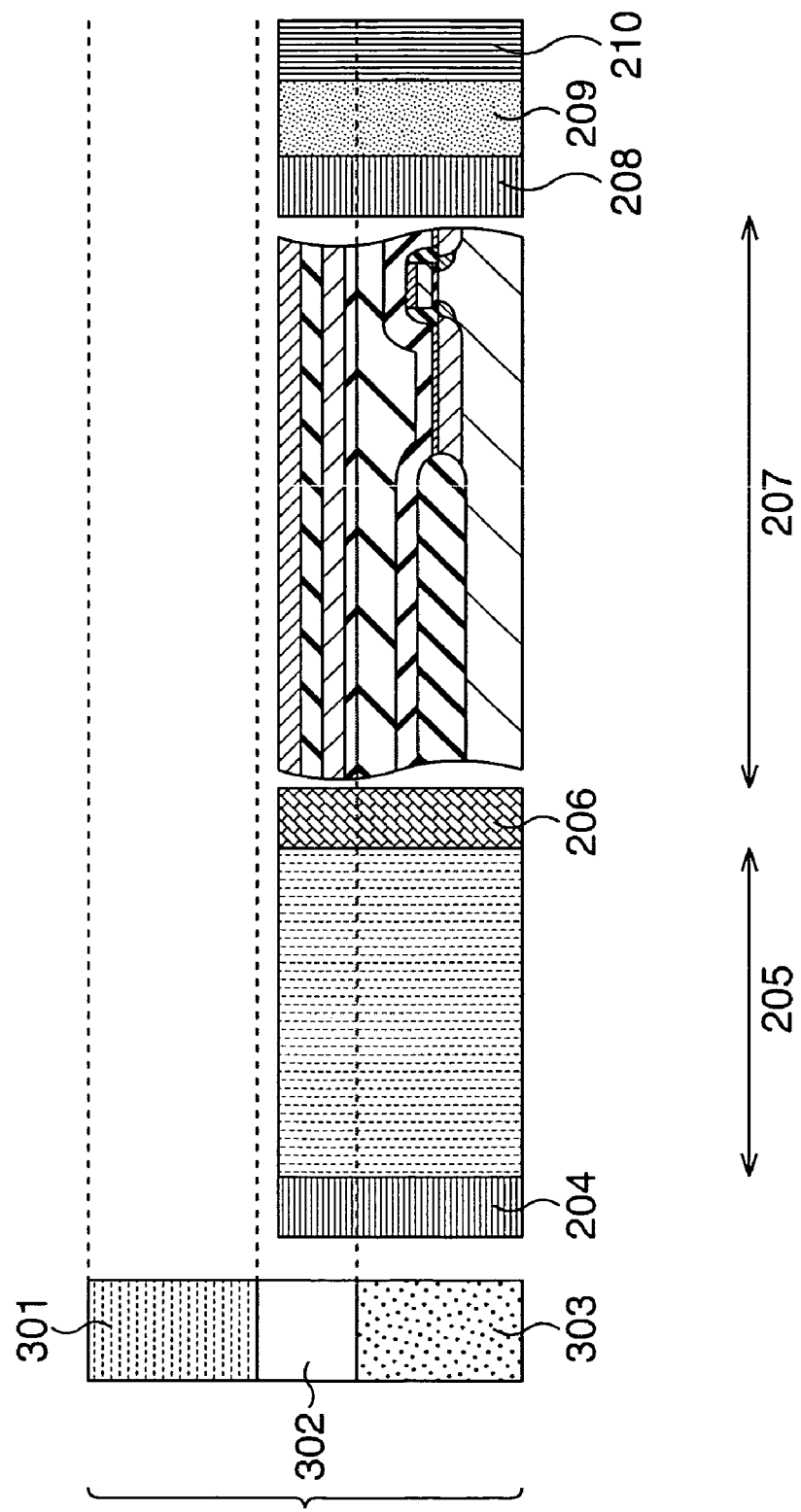
FIG. 12 is a cross sectional view illustrating a vertical structure of a semiconductor device according to an embodiment of the present invention.

Further, as shown in FIG. 12, by partitioned a vertical structure of the semiconductor device, it can be said that the semiconductor device is composed of a wiring layer 301, a ferroelectric layer 302 and a transistor layer 303. The transistor layer 303 includes transistors (not shown) used with the FeRAM memories and transistors (not shown) used with the logic circuit section 205. In the FeRAM section 207, the transistors are positioned near or below the FeRAM capacitors, while in the logic circuit section 205, the transistors are positioned near or below the logic circuits. For simplifying the drawings, illustration of the transistors in the logic portion 205 is omitted.

Figure 2A:
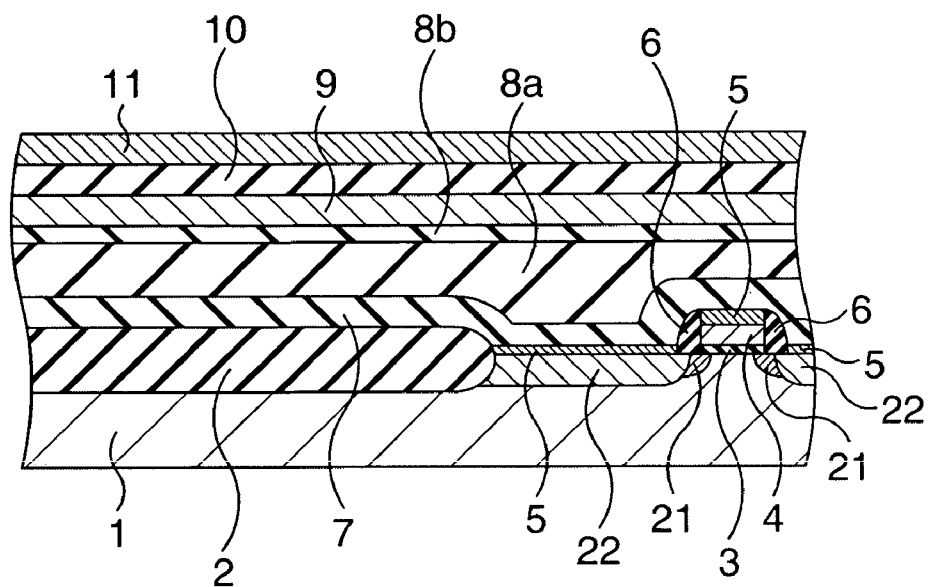
FIGS. 2A to 2H are cross sectional views illustrating, in the order of processes, a fabricating method of a ferroelectric memory according to a first embodiment of the present invention.
Figure 11:
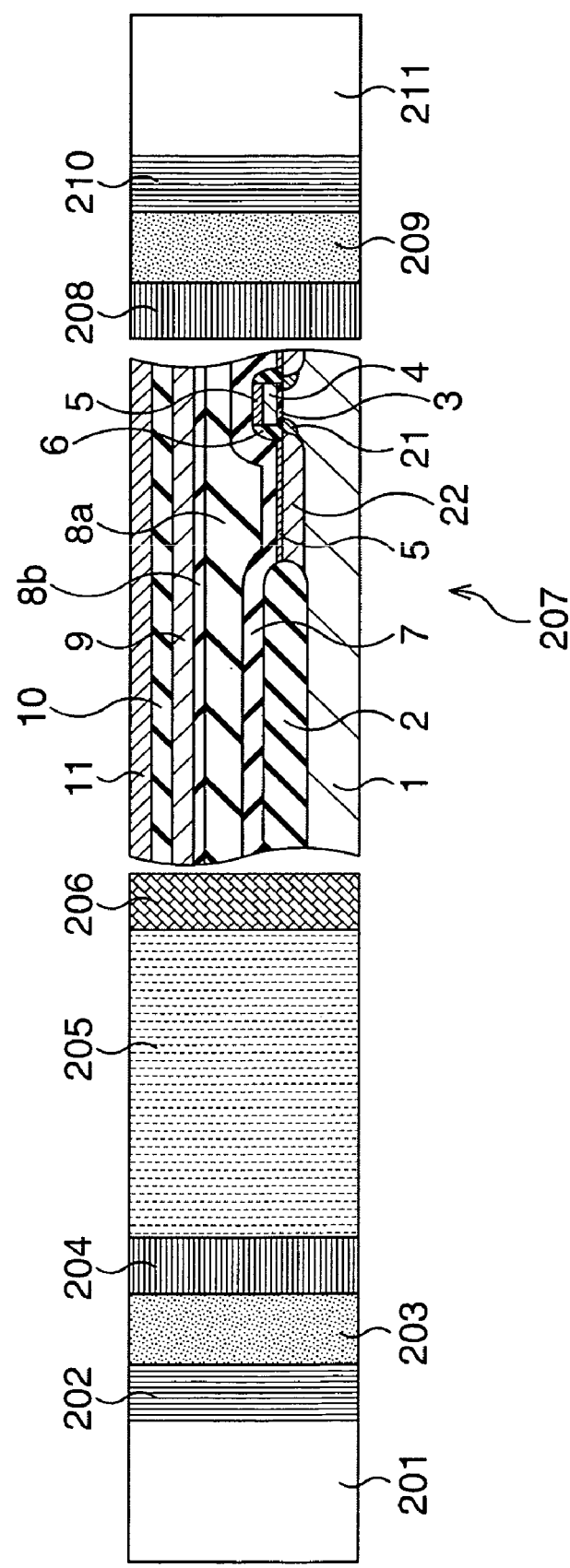
FIG. 11 is a view illustrating a cross sectional layout of a semiconductor device according to an embodiment of the present invention.

In the present embodiment, first, as shown in FIG. 2A and FIG. 11, a element isolation insulating film 2 for partitioning an element active region is formed at the surface of a semiconductor substrate 1 such as a Si substrate, by, for example, a LOCOS (Local Oxidation of Silicon) method. Next, a transistor (MOSFET) is formed in the element active region partitioned by the element isolation insulating film 2, wherein the transistor includes a gate insulation film 3, a gate electrode 4, a silicide layer 5, a side wall 6, and source/drain diffusion layers composed of a low-concentration diffusion layer 21 and a high-concentration diffusion layer 22. The transistor corresponds to the MOS transistor 102 in FIG. 1. As the gate insulation film 3, for example, a $SiO_2$ film with a thickness of about 100 nm is formed by thermal oxidation. Next, a silicon oxynitride film 7 is formed over the entire surface such that it covers the MOSFET and then a silicon oxide film 8a is formed over the entire surface. The silicon oxynitride film 7 is formed in order to prevent degradation of the gate insulation film 3 or the like due to hydrogen during the formation of the silicon oxide film 8a. The silicon oxide film 8a is formed by a CVD method, for example, with using TEOS (tetraethylorthosilicate) as material, and a thickness thereof is about 700 nm.

Then, an annealing process is performed in an atmosphere of $N_2$ at 650° C. for 30 minutes to degas the silicon oxide film 8a. Next, an $Al_2O_3$ film 8b with a thickness of about 20 nm is formed on the silicon oxide film 8a as a bottom-electrode adhesive layer, for example, by a sputtering method. A bottom electrode film 9 is formed on the $Al_2O_3$ film 8b. As the bottom electrode film 9, for example, a Pt film with a thickness of about 150 nm is formed by a sputtering method.

Next, similarly as shown in FIG. 2A, a ferroelectric film 10 in an amorphous state is formed on the bottom electrode film 9. As the ferroelectric film 10, for example, a PLZT film with a thickness of about 100 nm to 200 nm is formed by an RF sputtering method using a PLZT ((Pb, La) (Zr, Ti) $O_3$) target. Subsequently, heat treatment (RTA: Rapid Thermal Annealing) is performed in an atmosphere containing Ar and $O_2$ at a temperature of 650° C. or less and further RTA is performed in an oxygen atmosphere at 750° C. As a result, the ferroelectric film 10 is completely crystallized and also the Pt film constituting the bottom electrode film 9 is densified, thus suppressing interdiffusion of Pt and O near the interface between the bottom electrode film 9 and the ferroelectric film 10.

Then, similarly as shown in FIG. 2A, a top electrode film 11 is formed on the ferroelectric film 10. In order to form the top electrode film 11, for example, an iridium oxide film with a thickness of about 200 nm to 300 nm is formed by a sputtering method.

Figure 2B:
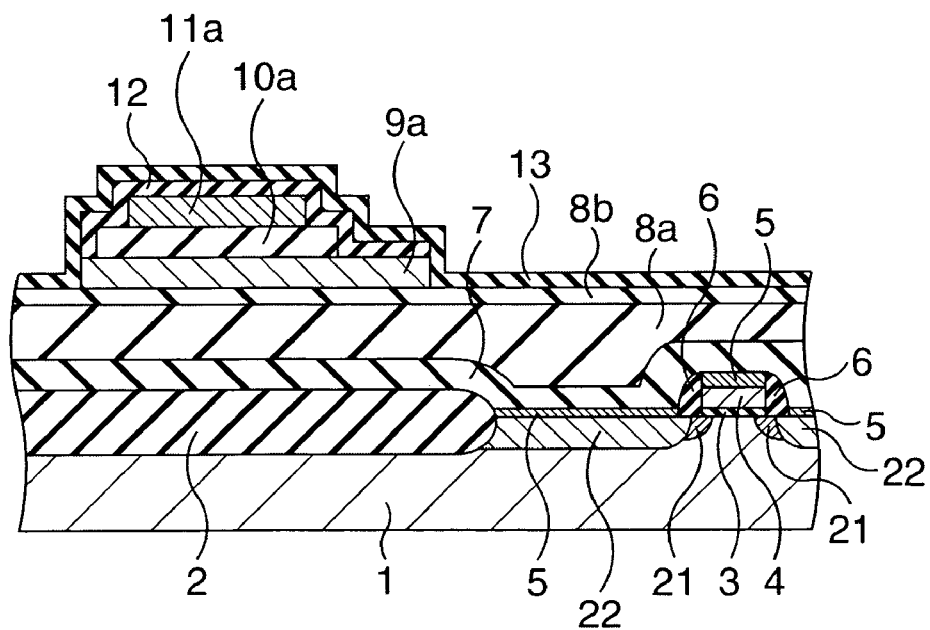

Then, the top electrode film 11 is patterned to form a top electrode 11a as shown in FIG. 2B. Then, heat treatment is performed in an atmosphere containing oxygen in order to alleviate damages caused by the patterning. Then, the ferroelectric film 10 is patterned to form a capacitor insulation film 10a as shown in FIG. 2B. Subsequently, oxygen annealing is performed for preventing exfoliation of an $Al_2O_3$ film to be formed later. Then, similarly as shown in FIG. 2B, an $Al_2O_3$ film 12 is formed over the entire surface as a protective film by a sputtering method. In order to alleviate damages caused by the sputtering, oxygen annealing is performed. The protective film ($Al_2O_3$ film 12) prevents intrusion of hydrogen from the outside into the ferroelectric capacitor.

Subsequently, similarly as shown in FIG. 2B, the $Al_2O_3$ film 12 and the bottom electrode film 9 are patterned to form a bottom electrode 9a. Then, oxygen annealing is performed for preventing exfoliation of an $Al_2O_3$ film to be formed later. The ferroelectric capacitor including the bottom electrode 9a, the capacitor insulation film 10a and the top electrode 11a corresponds to the ferroelectric capacitor 101 in FIG. 1. Then, similarly as shown in FIG. 2B, an $Al_2O_3$ film 13 is formed as a protective film over the entire surface by a sputtering method. Next, oxygen annealing is performed in order to reduce capacitor leakage.

Figure 2C:
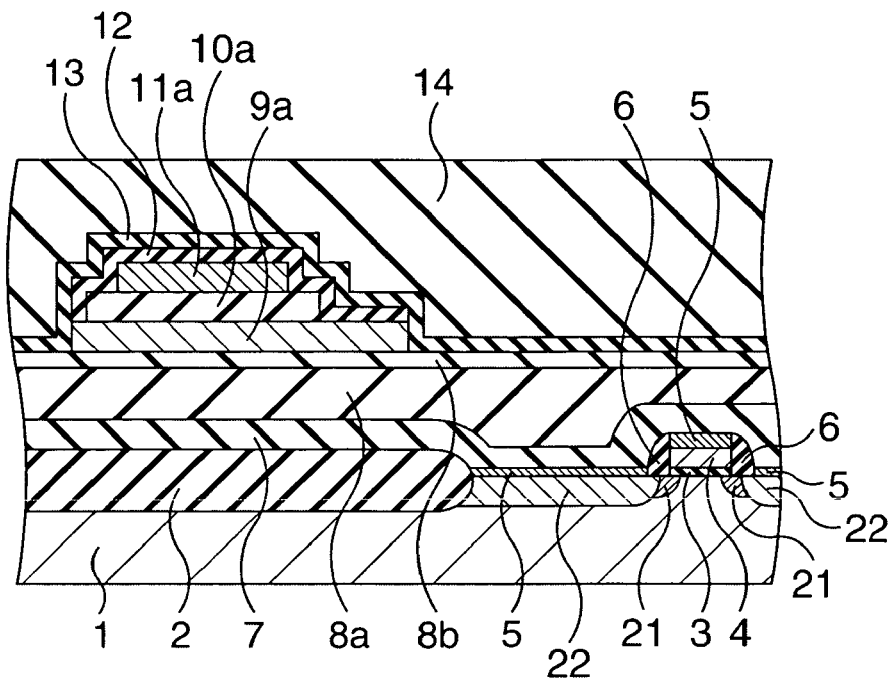

Next, as shown in FIG. 2C, an interlayer insulation film 14 is formed over the entire surface by a high-density plasma method. The thickness of the interlayer insulation film 14 is set to about 1.5 μm. Then, the interlayer insulation film 14 is flattened by a CMP (chemical mechanical polishing) method. Then, a plasma process is performed using $N_2O$ gas. As a result, the surface of the interlayer insulation film 14 is nitrided to some degree, which suppresses intrusion of moisture to the inside thereof. Such a plasma process may be effective when using gas containing at least one of nitrogen or oxygen.

Figure 2D:
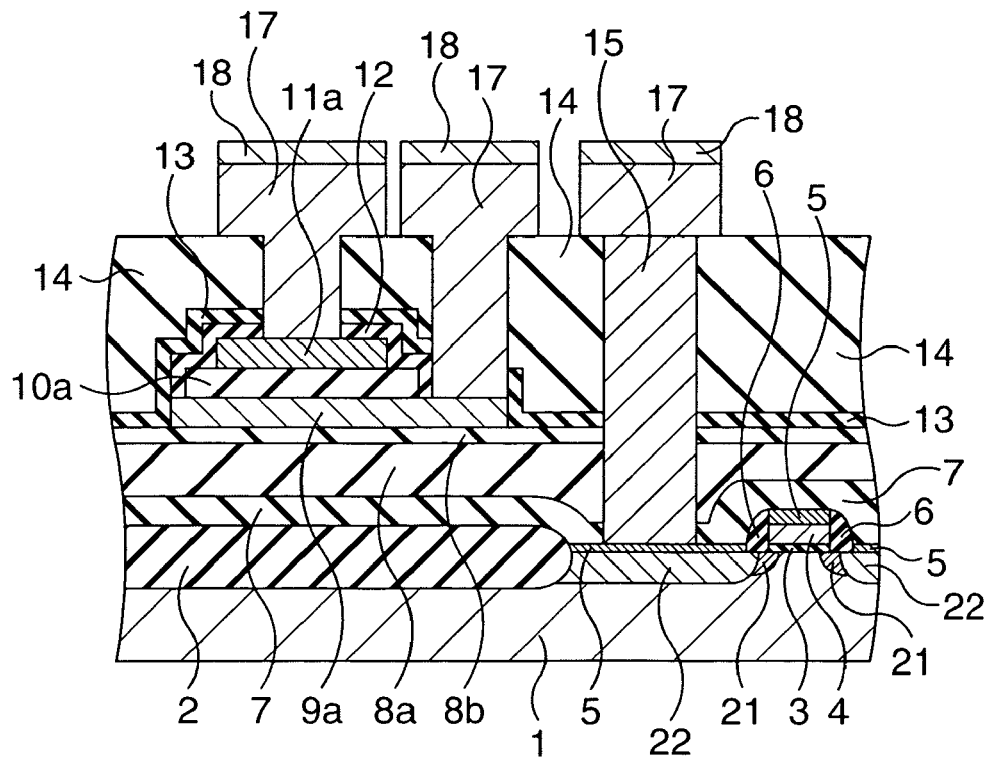

Then, as shown in FIG. 2D, a hole reaching the silicide layer 5 on the high-concentration diffusion layer 22 of the transistor is formed through the interlayer insulation layer 14, the $Al_2O_3$ film 13, the $Al_2O_3$ film 8b, the silicon oxide film 8a and the silicon oxynitride film 7. Subsequently, a Ti film and a TiN film are successively formed in the hole by a sputtering method to form a barrier metal film (not shown). Then, a W film is embedded in the hole by a CVD (chemical vapor deposition) method and then the W film is flattened to form a W plug 15.

Then, a SiON film (not shown) is formed as an oxidation-prevention film for the W plug 15, for example, by a plasma high-speed CVD method. Subsequently, a contact hole reaching the top electrode 11a and a contact hole reaching the bottom electrode 9a are formed through the SiON film, the interlayer insulating film 14, the $Al_2O_3$ film 13 and the $Al_2O_3$ film 12. Then, in order to alleviate damages, oxygen annealing is performed. Next, the SiON film is removed from the entire surface by etching back to expose the surface of the W plug 15. Then, similarly as shown in FIG. 2D, an Al film 17 and a conductive barrier film 18 are formed at the state where a portion of the surface of the top electrode 11a, a portion of the surface of the bottom electrode 9a and the surface of the W plug 15 are exposed, and these films are patterned to form wiring. At this time, for example, the W plug 15 and the top electrode 11a are interconnected via a portion of the wiring. Further, it is preferable that a conductive barrier film is also formed before the formation of the Al film 17. As the conductive barrier film 18, for example, a TiN film, a TiSiN film, a TaN film, a CrN film, an HfN film, a ZrN film, a TiAlN film, a TaAlN film, a CrAlN film, an HfAlN film or the like may be employed. Also, these films may be laminated. Also, as the conductive barrier film 18, a silicide film such as a TiSi film, CoSi or the like may be employed.

Figure 2E:
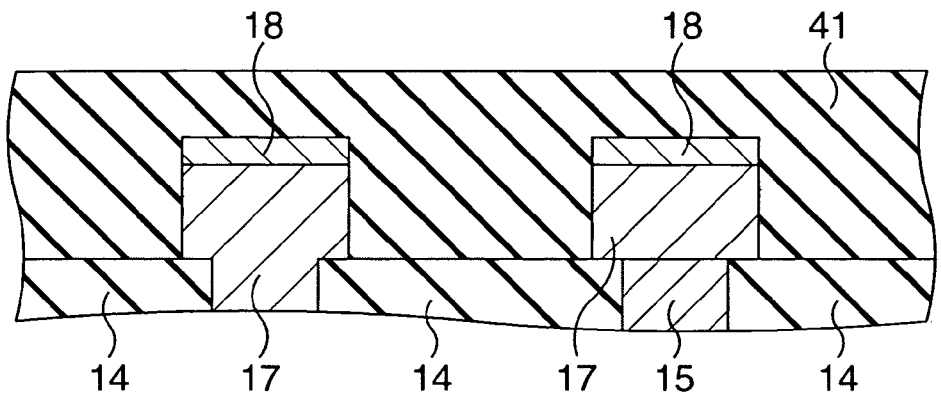

Then, as shown in FIG. 2E, an $Al_2O_3$ film with a thickness greater than that of the wiring can be formed.

Figure 2F:
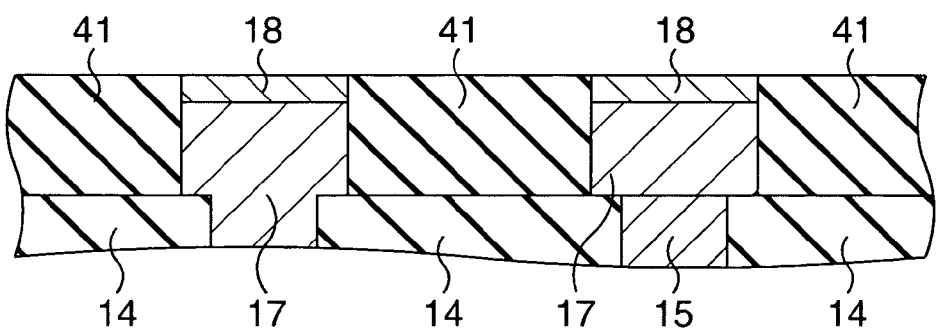

Then, as shown in FIG. 2F, the $Al_2O_3$ film 41 is polished by CMP (flattening), until the conductive barrier film 18 is exposed. Namely, CMP is applied to the $Al_2O_3$ film 41 by using the conductive barrier film 18 as a stopper film.

Figure 2G:
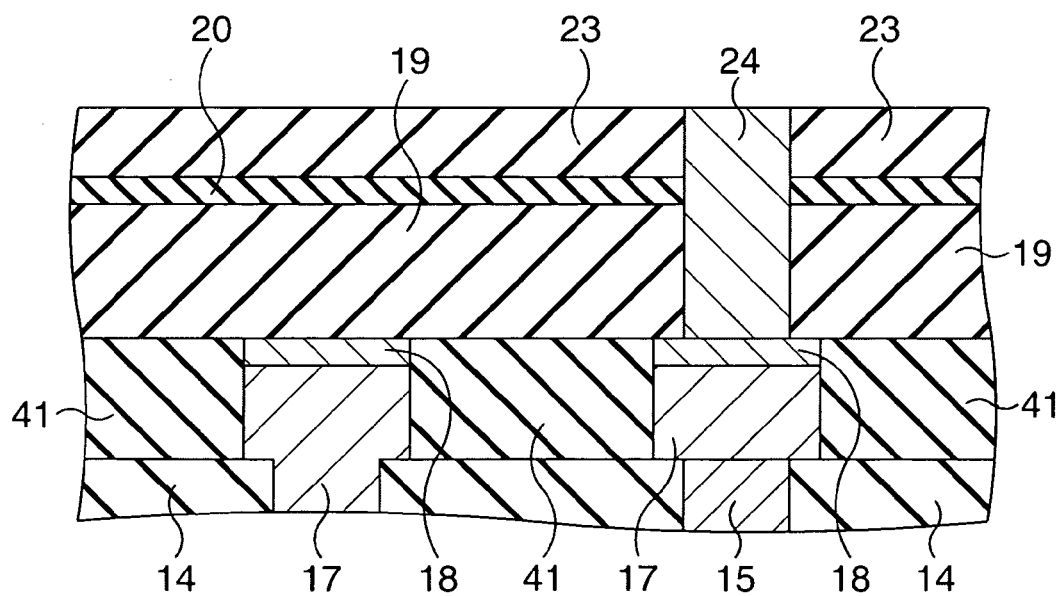

Then, as shown in FIG. 2G, a silicon oxide film 19 is formed over the entire surface, for example, by a high density plasma method and then the surface thereof are flattened. Then, an $Al_2O_3$ film 20 is formed on the silicon oxide film 19 as a protective film for preventing intrusion of hydrogen and moisture. Further, a silicon oxide film 23 is formed on the $Al_2O_3$ film 20, for example, by a high-density plasma method.

Subsequently, similarly as shown in FIG. 2G, a via hole reaching the conductive barrier film 18 is formed through the silicon oxide film 23, an $Al_2O_3$ film 20 and the silicon oxide film 19, and then a W plug 24 is embedded therein.

According to the present embodiment, there is no $Al_2O_3$ film, which is difficult to process, on the conductive barrier film 18, when the via hole is formed. This enables easily forming a via hole with a desired shape. Consequently, it is possible to avoid narrowing of the via hole and inconvenience caused by substances deposited during etching, as conventionally arisen.

Figure 2H:
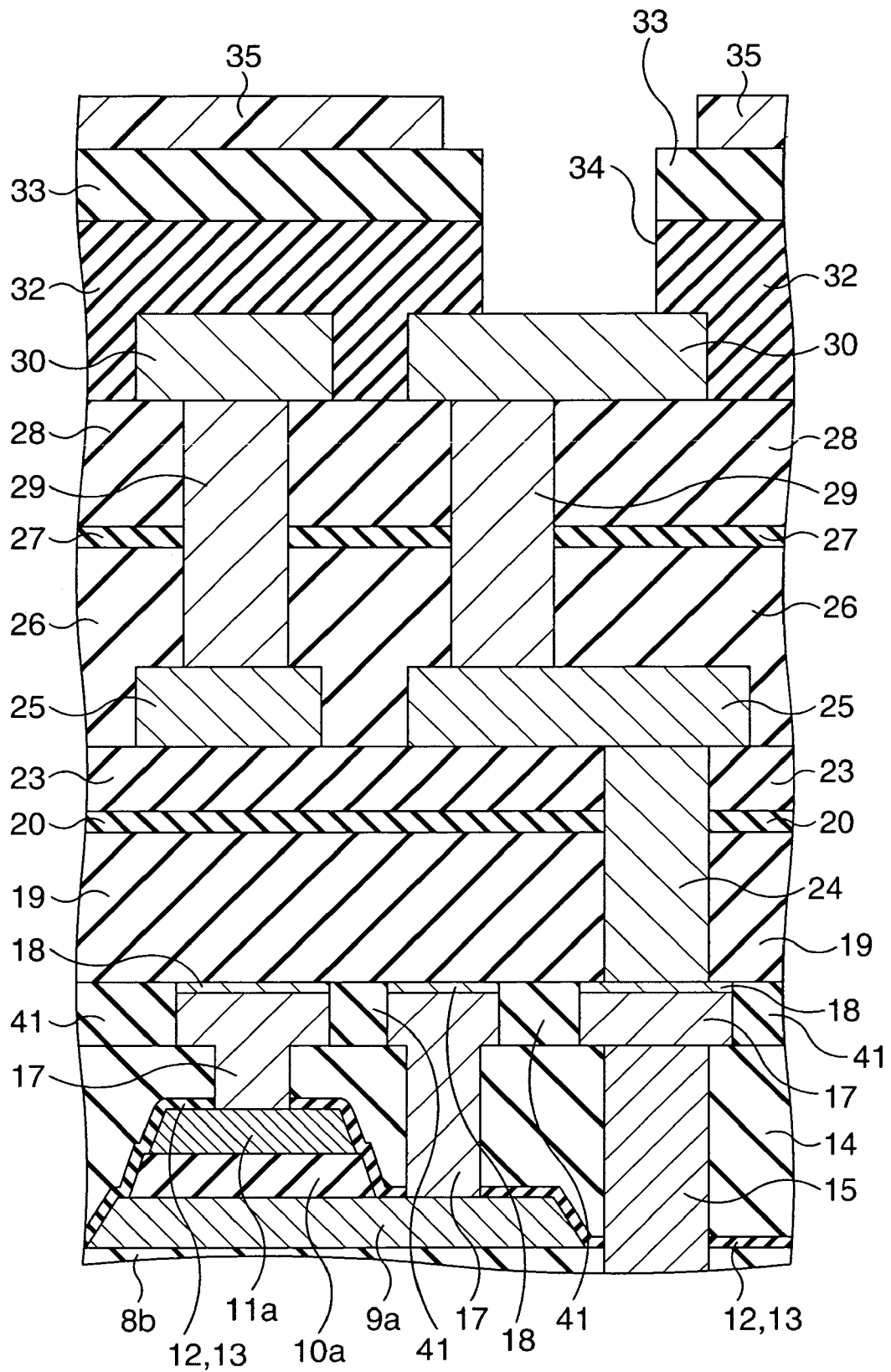

Then, after the formation of the W plug 24, as shown in FIG. 2H, a wiring 25, a silicon oxide film 26, an $Al_2O_3$ film 27, a silicon oxide film 28, a W plug 29, an Al wiring 30, a silicon oxide film 32, a silicon nitride film 33, a polyimide layer 35 and a pad opening 34 are formed. The portion of the Al wiring 30 exposed at the pad opening 34 is used as a pad.

As described above, the formation of a ferroelectric memory including a ferroelectric capacitor is completed.

Thus, according to the present embodiment, since the $Al_2O_3$ film 41 (the protective film) is not left on the wiring, a via hole can be easily formed as designed.

Figure 13:
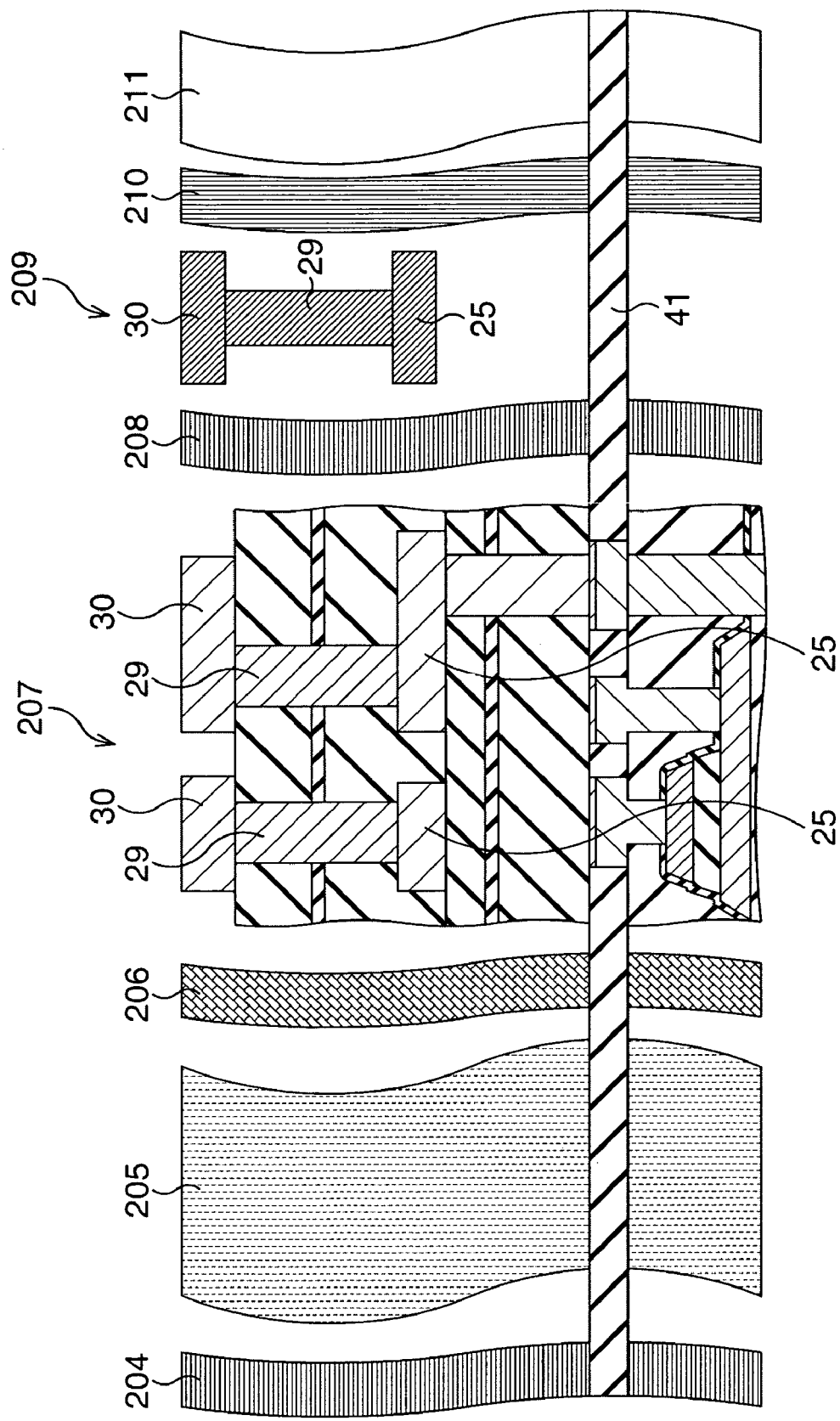
FIG. 13 is a view illustrating an $Al_2O_3$ film 41.
Figure 14A:
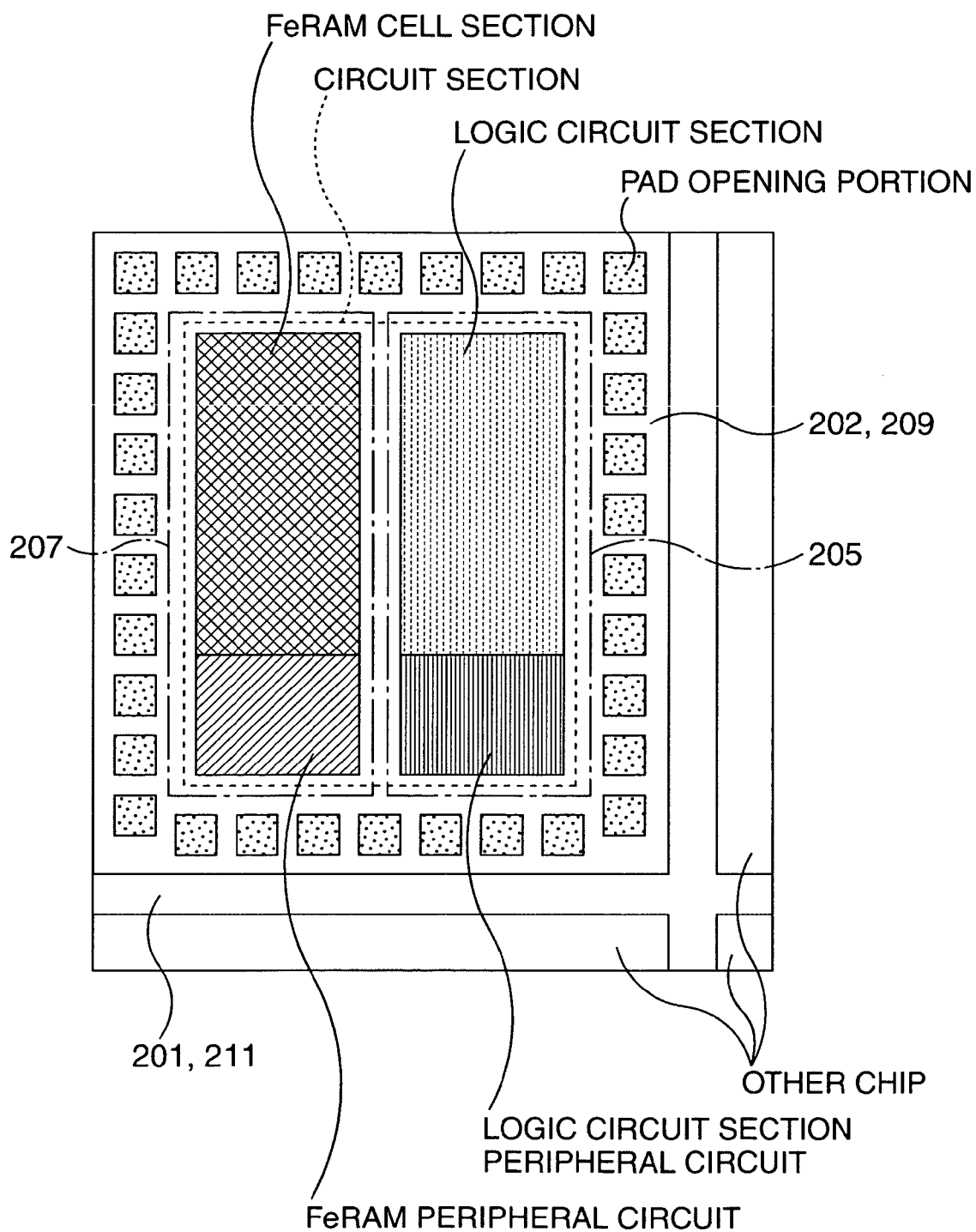
FIG. 14A is a view illustrating a layout of a semiconductor device according to an embodiment of the present invention.
Figure 14B:
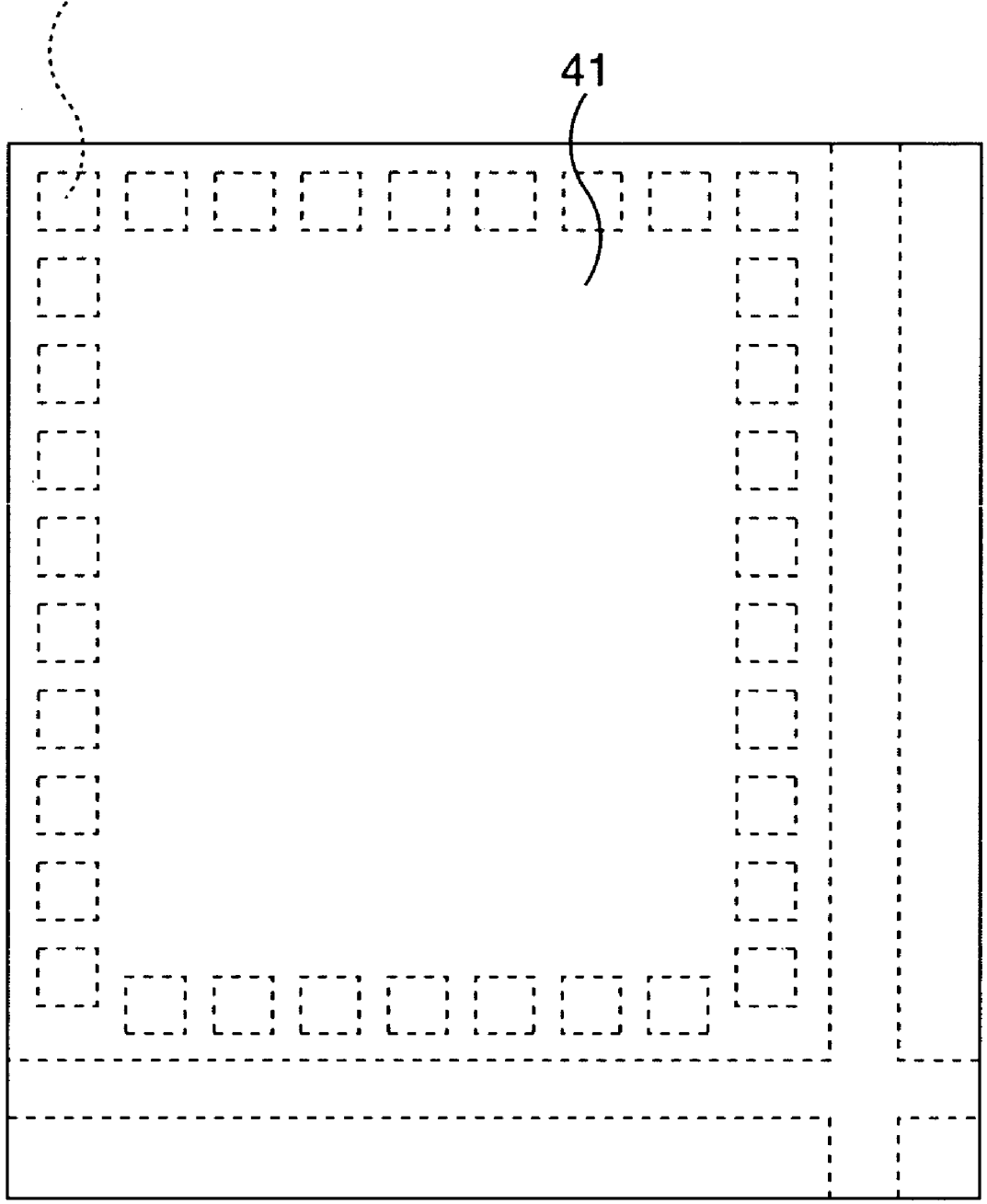
FIG. 14B is a view illustrating a layout of an $Al_2O_3$ film 41.

Further, the $Al_2O_3$ film 41 as a protective film is formed at the regions other than the PAD opening portions, as shown in FIG. 13 and FIG. 14B. As previously described, the semiconductor device may be partitioned into the scribe section 211, the scribe section—PAD section boundary section 210, the PAD section 209, the PAD section—circuit section boundary section 208, the FeRAM section (cell section) 207, the circuit—circuit boundary section 206, the logic circuit section 205, the PAD section—circuit section boundary section 204 and the like. Further, a layout thereof is as shown in FIG. 14A. Further, the wiring under the PADs may be either Al—Cu wiring or embedded Cu wiring.

Figure 3:
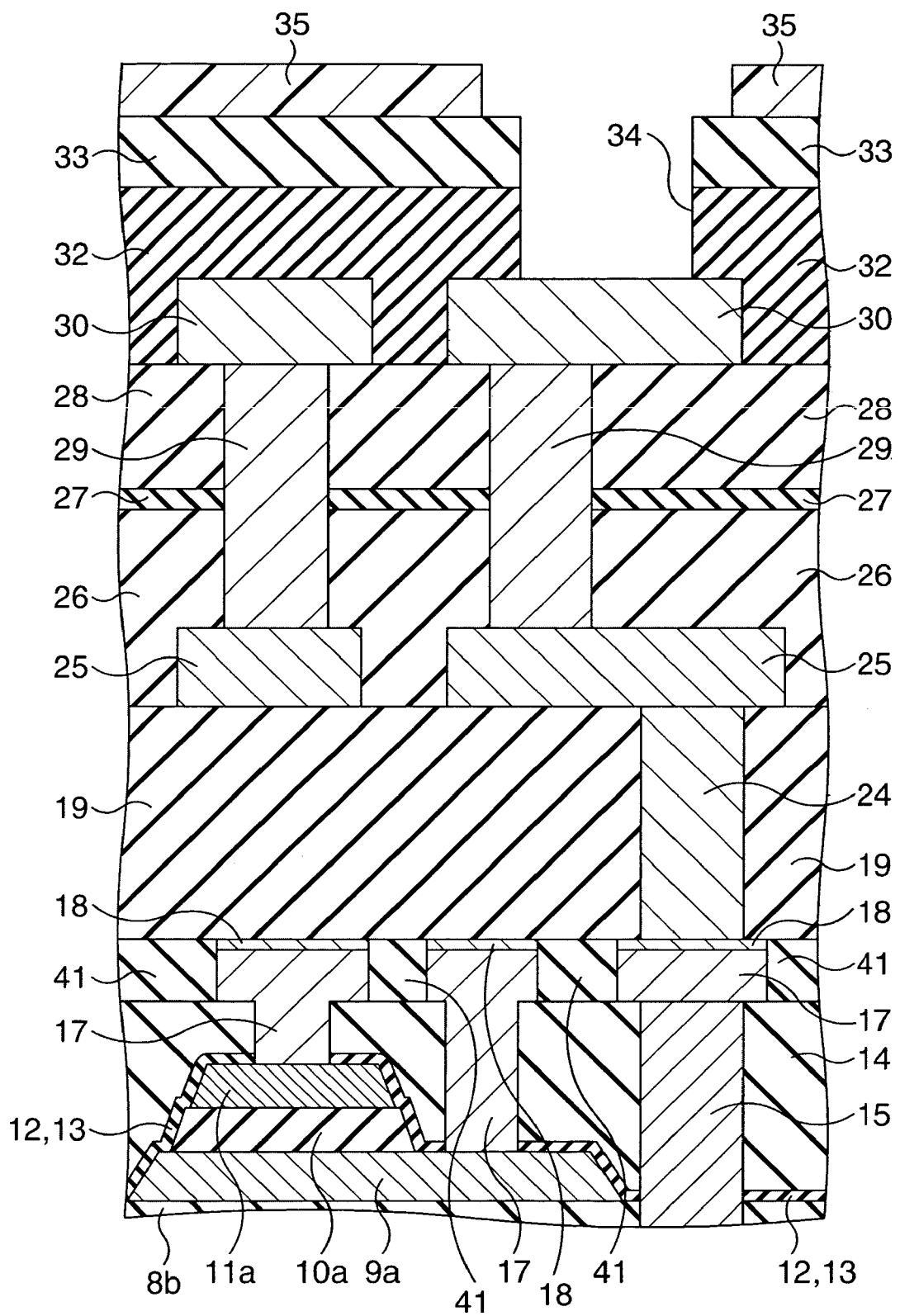
FIG. 3 is a cross sectional view illustrating a ferroelectric memory according to another embodiment.

Further, while in the first embodiment, the $Al_2O_3$ film 20 is formed between the silicon oxide film 19 and the silicon oxide film 23, the silicon oxide film 19 may be formed to have a large thickness without forming the $Al_2O_3$ film 20 and the silicon oxide film 23, as shown in FIG. 3.

Also, instead of the $Al_2O_3$ film 41, an oxide film, a nitride film, a carbide film or a polyimide film may be formed as a protective film. As an oxide film, a titanium oxide film and a coating-type oxide film (for example, a SOG (Spin on glass) film) may be exemplified. As a nitride film, a silicon nitride film, a silicon oxynitride film and a boron nitride film may be exemplified. As a carbide film, a silicon carbide film and a diamond-like-carbon film may be exemplified.

Figure 17:
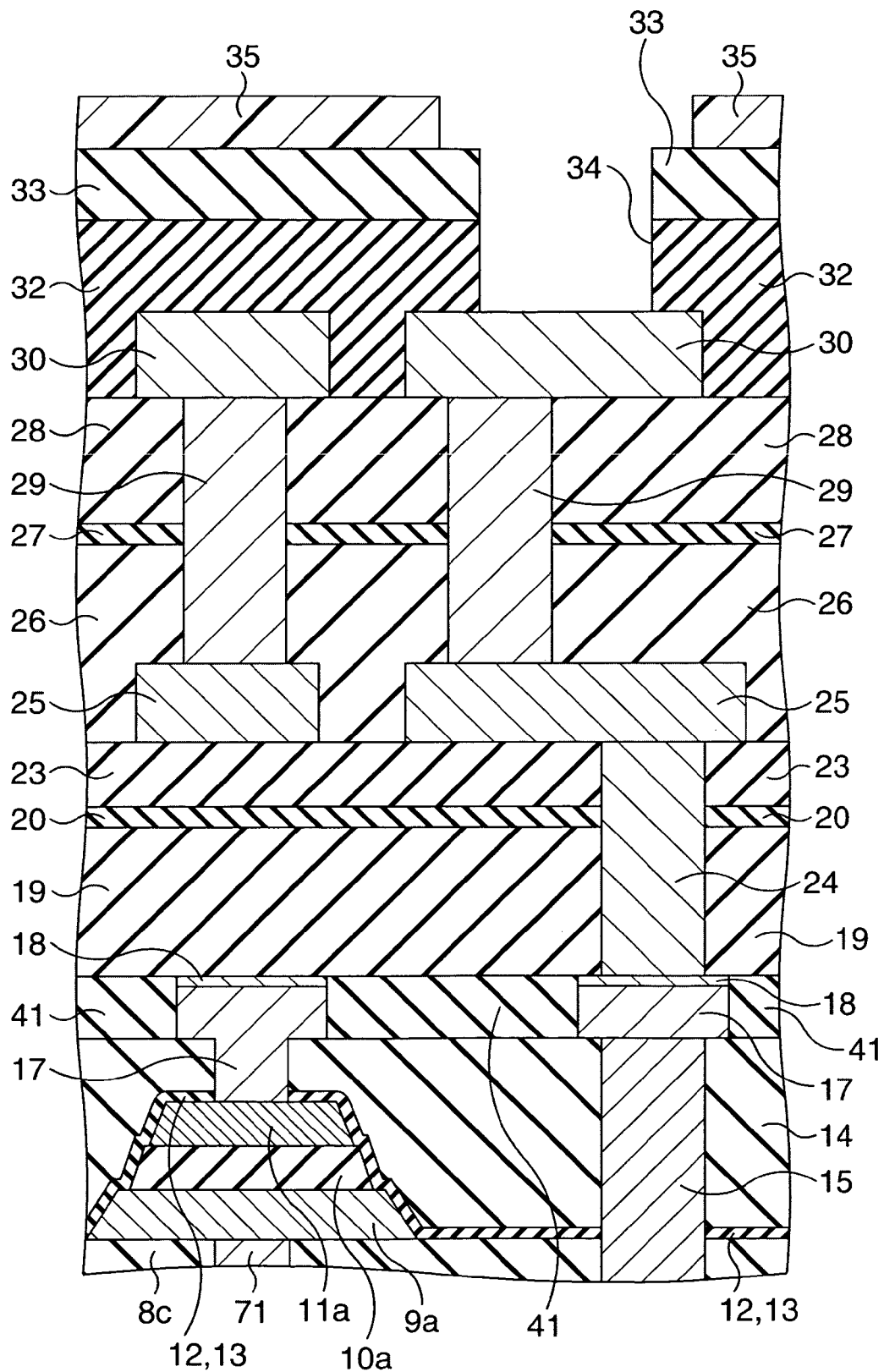
FIG. 17 is a cross sectional view illustrating an example of modification according to the first embodiment.

Further, while in the first embodiment, the structure of the ferroelectric capacitor is a planer-type, a stack-type structure as shown in FIG. 17 may be employed. In this case, a via plug 71 such as a W plug connected to the bottom electrode 9a is formed through a SiN film 8c or the like, which is a substitute of the $Al_2O_3$ film 8b. Further, while in FIG. 17, the ferroelectric capacitor has steps at the side surfaces thereof, such steps will not be formed in the case of utilizing a high-temperature collective etching technique. Furthermore, the utilization of a high-temperature collective etching technique enables miniaturization.

Second Embodiment

Figure 4A:
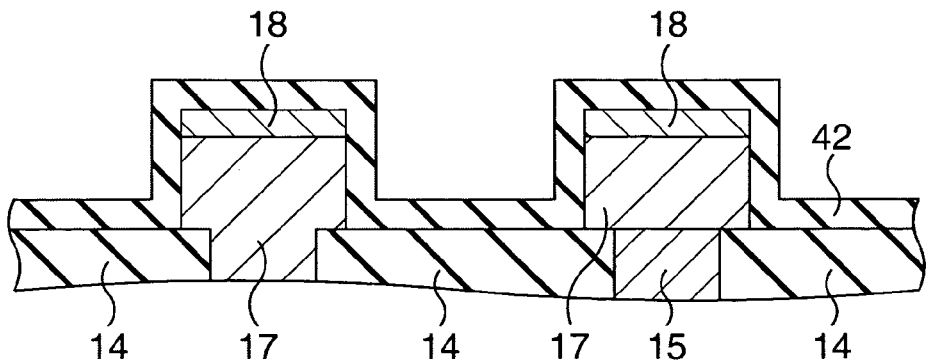
FIGS. 4A to 4C are cross sectional views illustrating, in the order of processes, a fabricating method of a ferroelectric memory according to a second embodiment of the present invention.
Figure 4B:
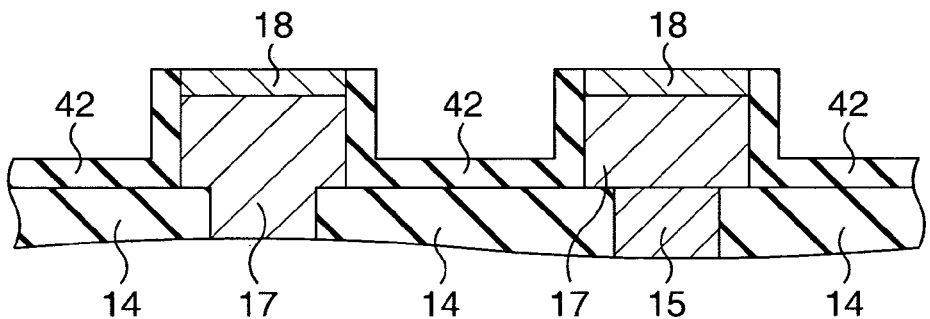
Figure 4C:
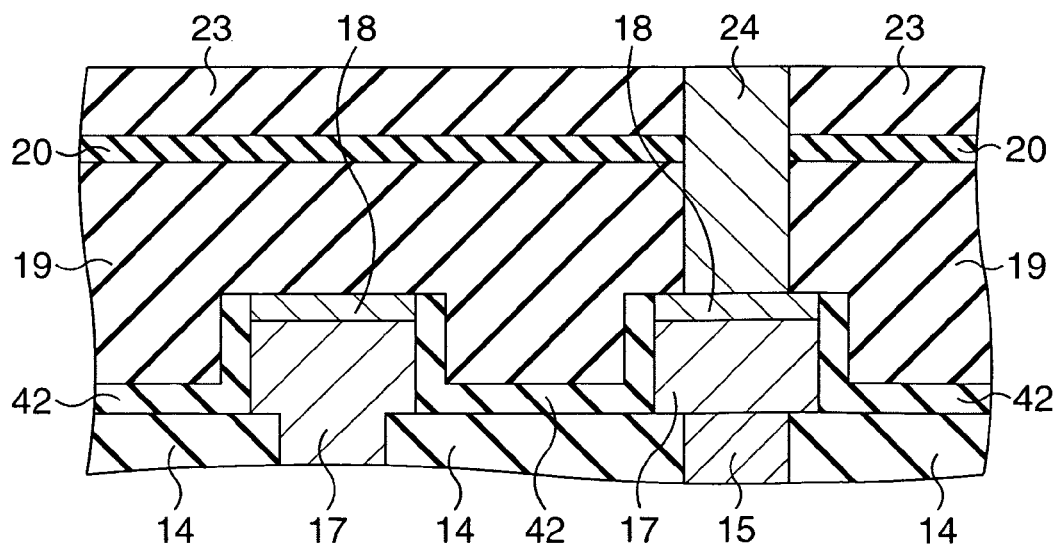

Next, the second embodiment of the present invention will be described. Here, for convenience, the cross sectional structure of the semiconductor device will be described along with the fabrication method of the same. FIGS. 4A to 4C are cross sectional views illustrating a method for fabricating a ferroelectric memory (semiconductor device) according to the second embodiment of the present invention, in the order of processes.

In the second embodiment, first, as shown in FIG. 4A, similarly to the first embodiment, a series of processes until the formation of wiring including the Al film 17 and the $Al_2O_3$ film 42 are performed. Next, an $Al_2O_3$ film 42 with a thickness smaller than that of the wiring is formed over the entire surface as a protective film. It is preferable that the thickness of the $Al_2O_3$ film 42 is equal to or more than 20 nm.

Then, as shown in FIG. 4B, the $Al_2O_3$ film 42 is polished by CMP (flattening) until the conductive barrier film 18 is exposed. Namely, CMP is applied to the $Al_2O_3$ film 42 by utilizing the conductive barrier film 18 as a stopper film.

Then, as shown in FIG. 4C, the silicon oxide film 19 is formed over the entire surface, for example, by a high-density plasma method and the surface thereof is flattened. Then, the $Al_2O_3$ film 20 is formed on the silicon oxide film 19 as a protective film. Further, the silicon oxide film 23 is formed on the $Al_2O_3$ film 20, for example, by a high-density plasma method.

Subsequently, as shown in FIG. 4C, the via hole reaching the conductive barrier film 18 is formed through the silicon oxide film 23, the $Al_2O_3$ film 20 and the silicon oxide film 19, and then the W plug 24 is embedded therein.

According to the present embodiment, similarly, there is no $Al_2O_3$ film, which is difficult to process, on the conductive barrier film 18, when the via hole is formed. Therefore, there are provided the same effects as in the first embodiment.

Third Embodiment

Figure 5A:
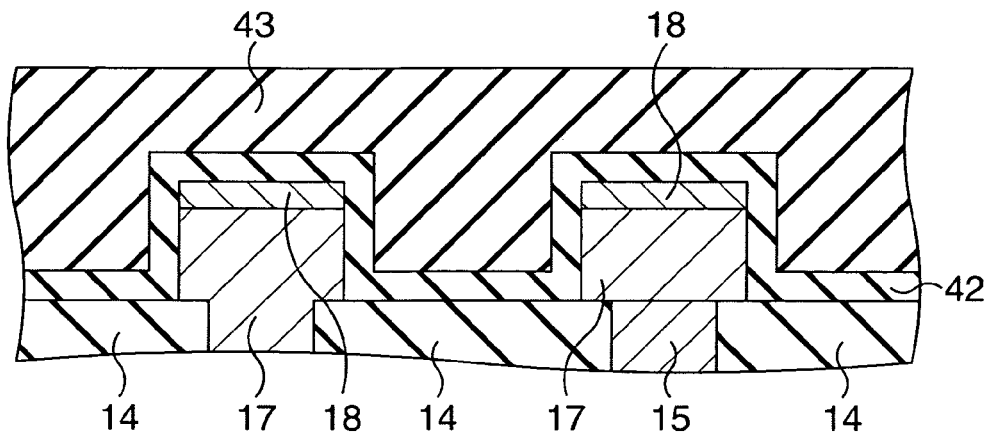
FIGS. 5A to 5C are cross sectional views illustrating, in the order of processes, a fabricating method of a ferroelectric memory according to a third embodiment of the present invention.
Figure 5B:
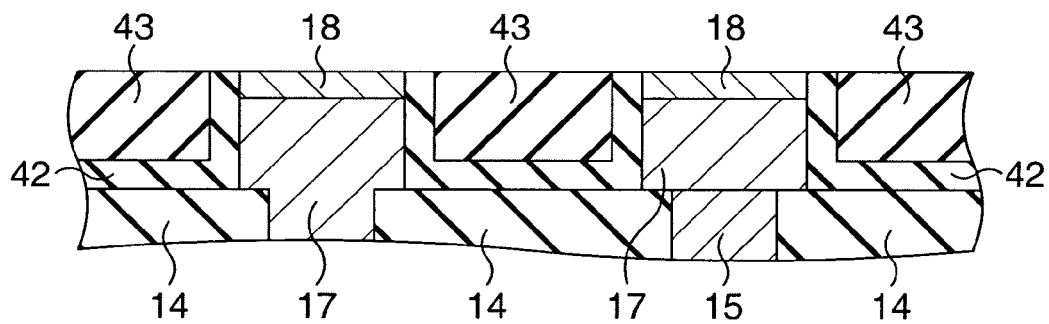
Figure 5C:
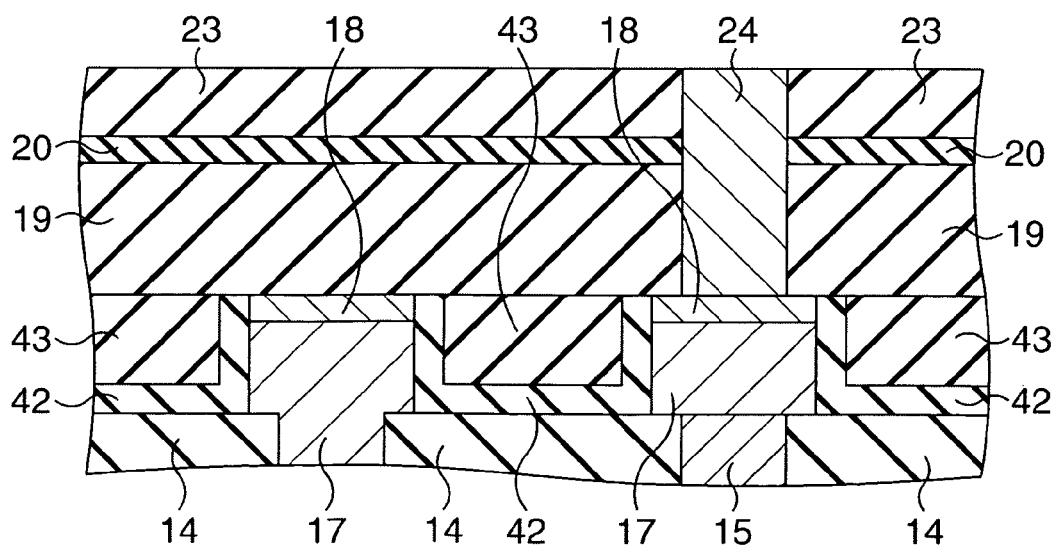

Next, the third embodiment of the present invention will be described. Here, for convenience, the cross sectional structure of the semiconductor device will be described along with the fabrication method of the same. FIGS. 5A to 5C are cross sectional views illustrating a method for fabricating a ferroelectric memory (semiconductor device) according to the third embodiment of the present invention, in the order of processes.

In the third embodiment, first, as shown in FIG. 5A, similarly to the second embodiment, a series of processes until the formation of the Al₂O₃ film 42 are performed. A silicon oxide film 43 with a thickness greater than that of the wiring is formed.

Then, as shown in FIG. 5B, the silicon oxide film 43 and the Al₂O₃ film 42 are polished by CMP (flattening) until the conductive barrier film 18 is exposed. Namely, CMP is applied to the silicon oxide film 43 and the Al₂O₃ film 42 by utilizing the conductive barrier film 18 as a stopper film.

Then, as shown in FIG. 5C, the silicon oxide film 19 is formed over the entire surface, for example, by a high density plasma method and the surface thereof is flattened. Then, the Al₂O₃ film 20 as a protective film is formed on the silicon oxide film 19. Further, the silicon oxide film 23 is formed on the Al₂O₃ film 20, for example, by a high-density plasma method.

Subsequently, as shown in FIG. 5C, the via hole reaching the conductive barrier film 18 is formed through the silicon oxide film 23, the Al₂O₃ film 20 and the silicon oxide film 19, and then the W plug 24 is embedded therein.

With the present embodiment, there are provided the same effects as in the second embodiment. Furthermore, since the silicon oxide film 43 exists around the Al₂O₃ film 42 during applying CMP to the Al₂O₃ film 42, high process accuracy can be achieved.

Fourth Embodiment

Next, the fourth embodiment of the presents invention will be described. Here, for convenience, the cross sectional structure of the semiconductor device will be described along with the fabrication method of the same. FIGS. 6A to 6J are cross sectional views illustrating a method for fabricating a ferroelectric memory (semiconductor device) according to the fourth embodiment of the present invention, in the order of processes.

Figure 6A:
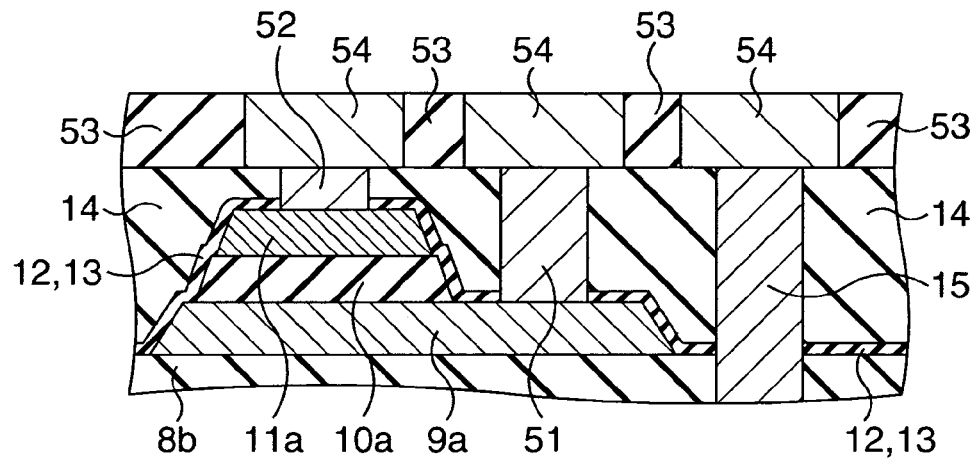
FIGS. 6A to 6J are cross sectional views illustrating, in the order of processes, a fabricating method of a ferroelectric memory according to a fourth embodiment of the present invention.

In the fourth embodiment, first, as shown in FIG. 6A, similarly to the first embodiment, a series of processes until the formation of the W plug 15 are performed. Next, a via plug 51 reaching the bottom electrode 9a and a via plug 52 reaching the top electrode 11a are formed. The materials of the via plug 51 and the via plug 52 are not particularly limited and, for example, W may be employed. Also, the via plug 51 and the via plug 52 may be formed in parallel with or prior to the formation of the W plug 15.

Then, similarly as shown in FIG. 6A, a silicon oxide film 53 is formed on the interlayer insulation film 14. As the silicon oxide film 53, for example, a silicon oxide film (NSG film) which is undoped with impurities may be formed. Then, wiring trench is formed in the silicon oxide film 53 and a Cu wiring 54 is formed therein. In order to form the Cu wiring 54, for example, a Cu material is embedded in the wiring trench and then it is flattened by CMP.

Figure 6B:
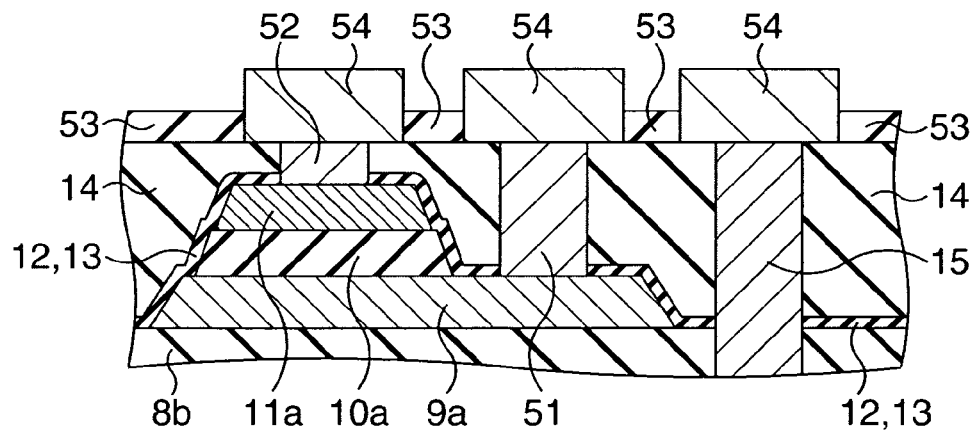

Then, as shown in FIG. 6B, the silicon oxide film 53 is etched back. As a result, the surface of the silicon oxide film 53 becomes lower than the surfaces of the Cu wirings 54.

Figure 6C:
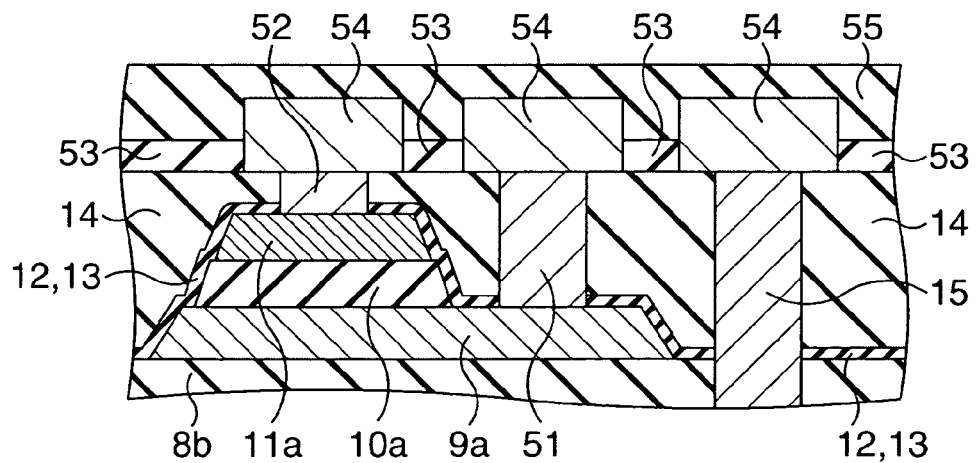

Next, as shown in FIG. 6C, an Al₂O₃ film 55 covering the Cu wiring 54 is formed over the entire surface as a protective film.

Figure 6D:
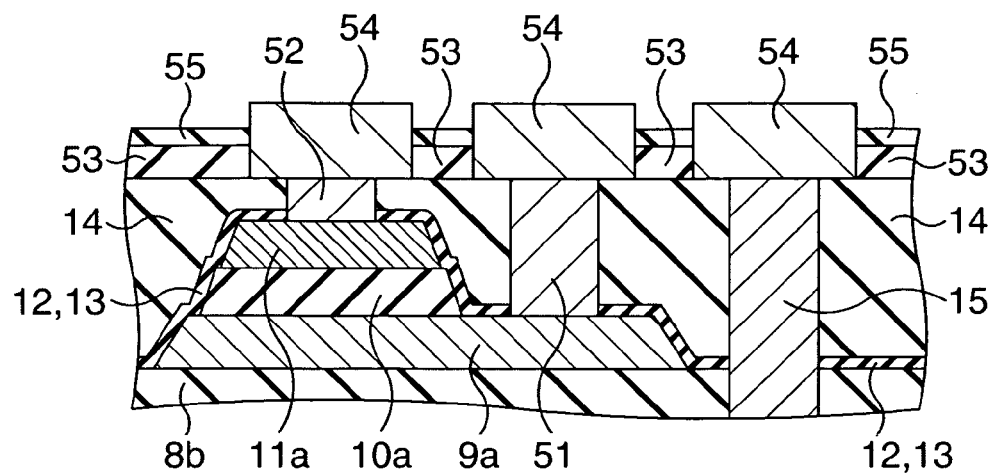

Then, as shown in FIG. 6D, the Al₂O₃ film 55 is polished by CMP until the Cu wiring 54 is exposed. Namely, CMP is applied to the Al₂O₃ film 55 by utilizing the Cu wiring 54 as a stopper film. While in FIG. 6D there is shown a state where the surface of the Al₂O₃ film 55 is lower than the surfaces of the Cu wiring 54, the surface of the Al₂O₃ film 55 may be at the same height as the surface of the Cu wiring 54.

Figure 6E:
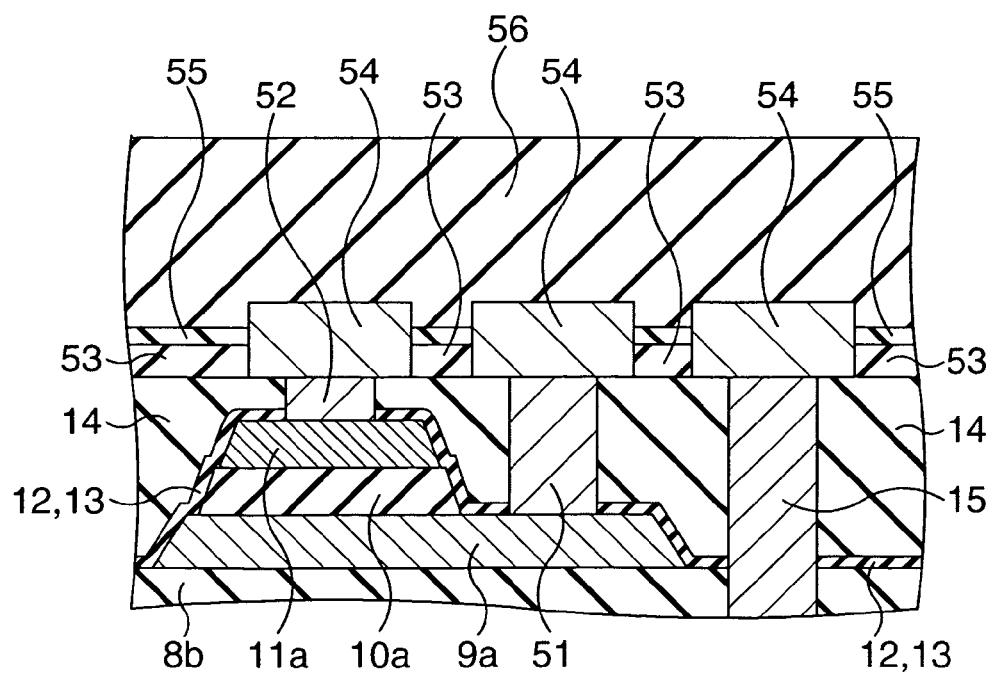

Then, as shown in FIG. 6E, a silicon oxide film 56 is formed over the entire surface. As the silicon oxide film 56, for example, a silicon oxide film (NSG film), which is undoped with impurities, may be formed. Then, the silicon oxide film 56 is flattened.

Figure 6F:
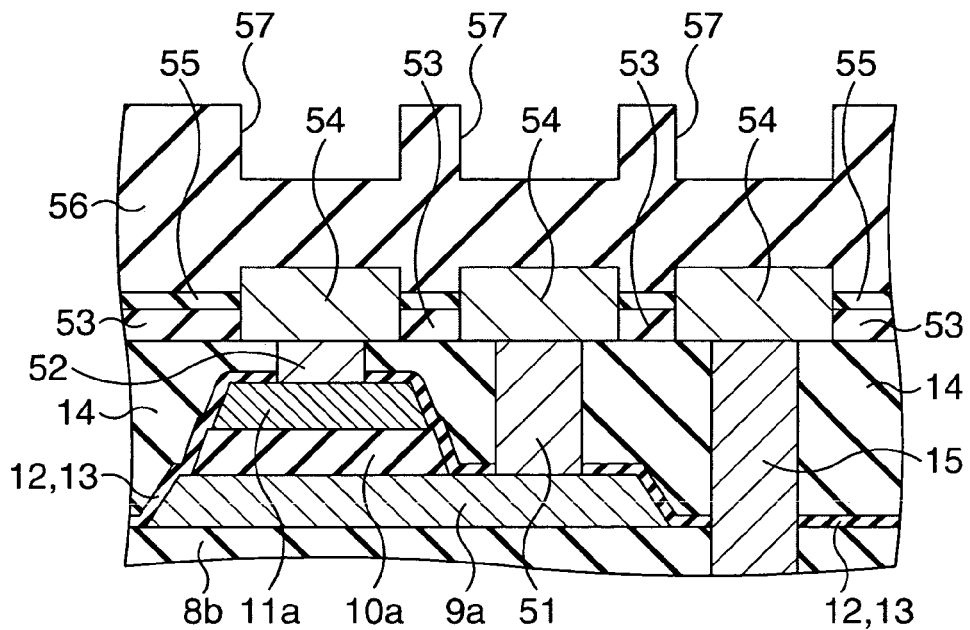

Then, as shown in FIG. 6F, a wiring trench 57 is formed in the silicon oxide film 56.

Figure 6G:
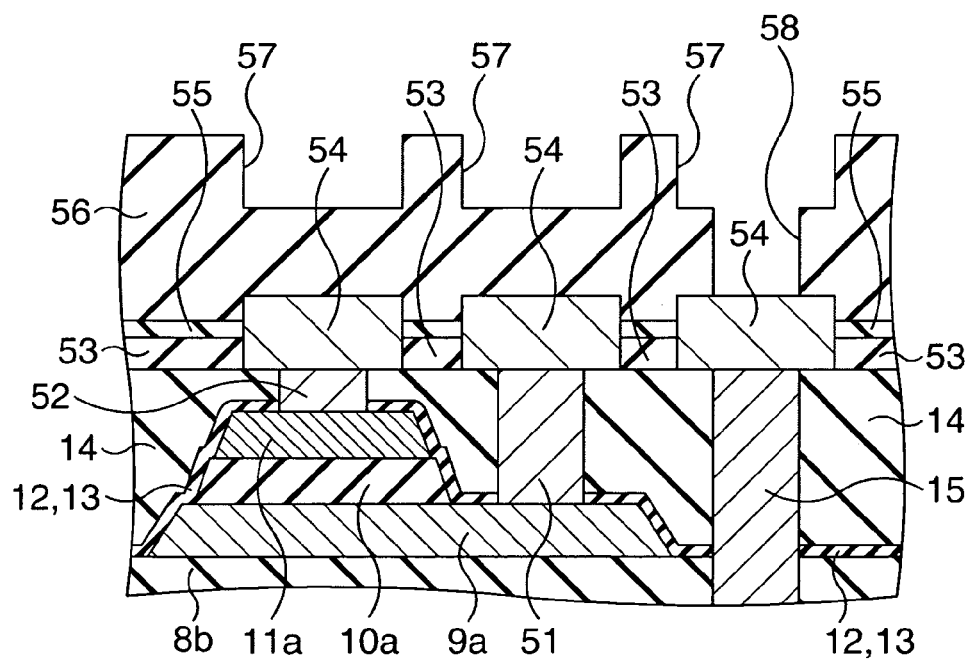

Next, as shown in FIG. 6G, a via hole 58 reaching the Cu wiring 54 is formed in the wiring trench 57.

Figure 6H:
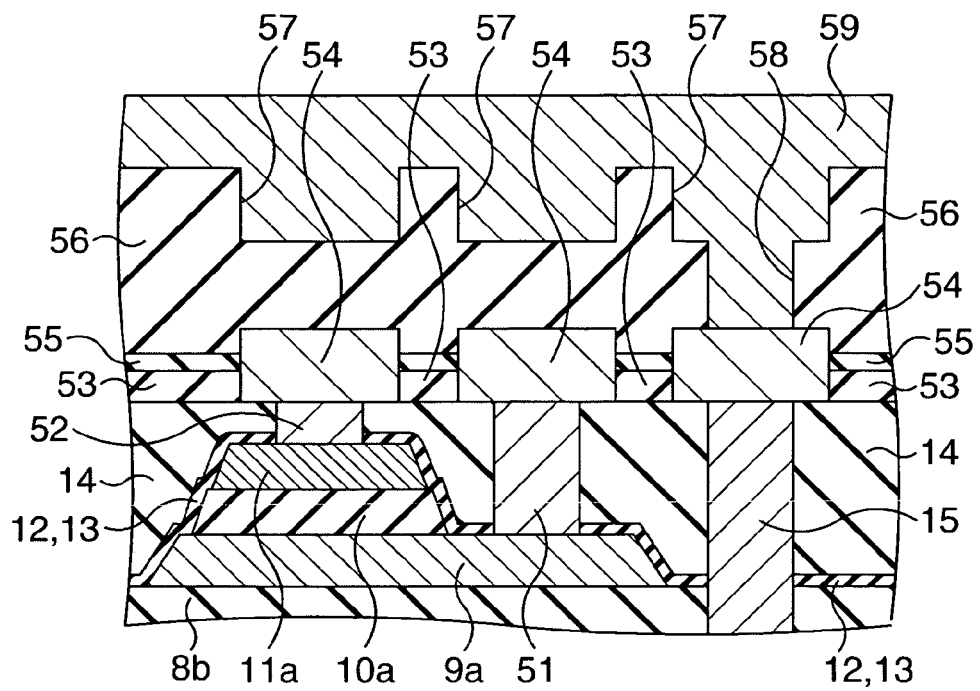

Then, as shown in FIG. 6H, a Cu material 59 is formed over the entire surface, for example, by plating such that it is embedded in the wiring trench 57 and the via hole 58. It is preferable that a seed layer (not shown) is formed prior to the formation of the Cu material 59.

Figure 6I:
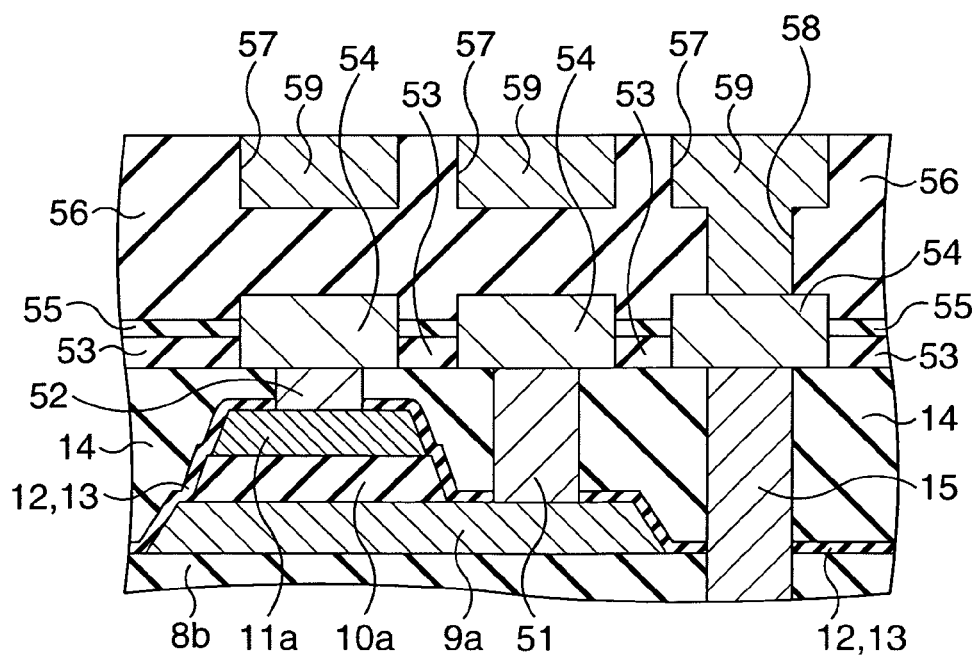

Then, as shown in FIG. 6I, CMP is applied to the Cu material 59 until the silicon oxide film 56 is exposed.

Figure 6J:
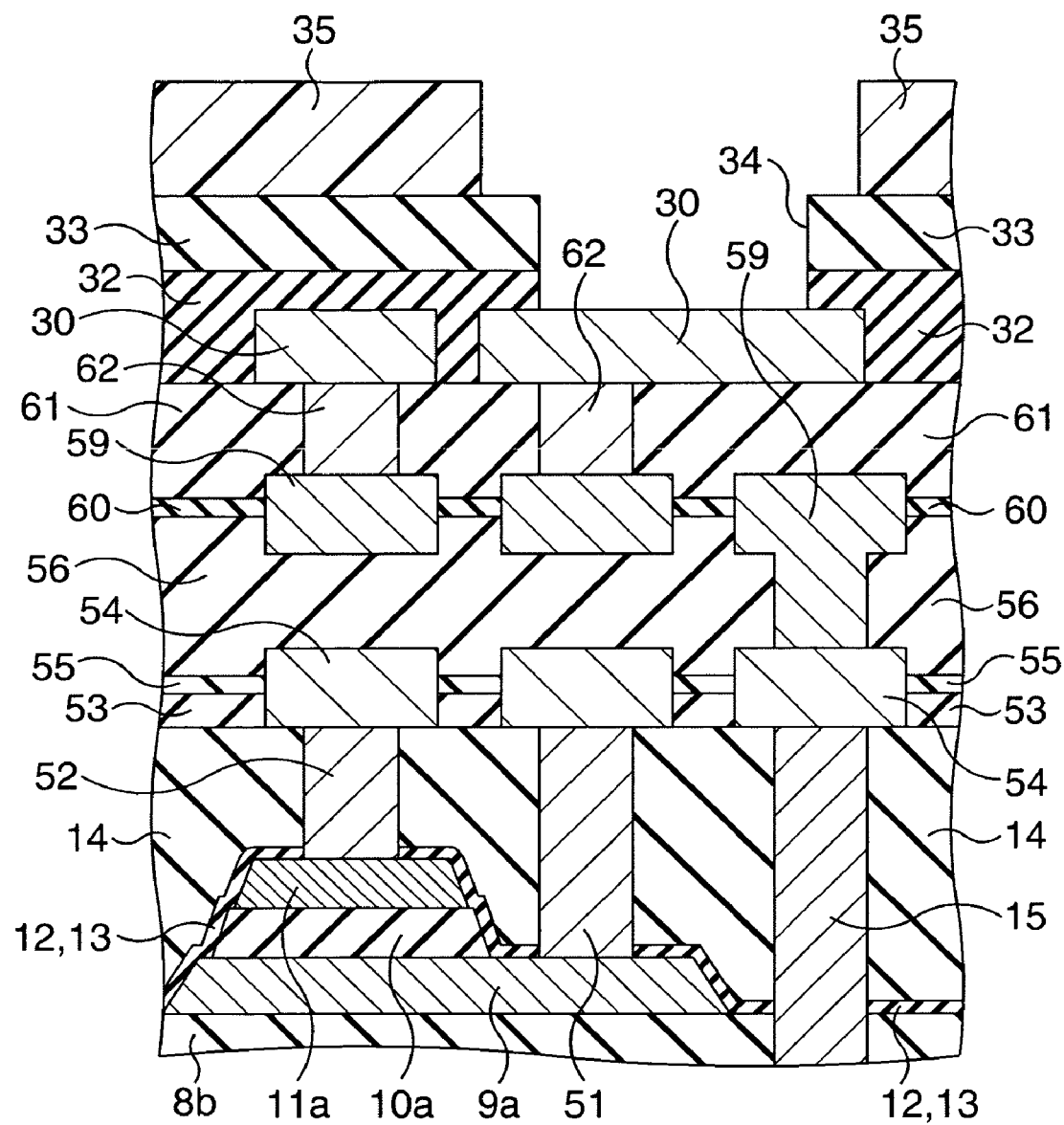

Then, as shown in FIG. 6J, the silicon oxide film 56 is etched back. Then, an Al₂O₃ film 60, a silicon oxide film 61, a via plug 62, the Al wiring 30, the silicon oxide film 32, the silicon nitride film 33, the polyimide layer 35 and the pad opening 34 are formed. The portion of the Al wiring 30 exposed at the pad opening 34 is utilized as a pad. The number of the wiring layers may be, for example, 20 or more.

Thus, the formation of a ferroelectric memory including a ferroelectric capacitor is completed.

Since in the present embodiment a damascene method is utilized for forming the Cu wirings, the present embodiment is suitable for miniaturization. Further, since the Al₂O₃ films 55 and 60 are formed around the Cu wirings as protective films, it is possible to suppress degradation of the ferroelectric capacitor. Further, since after the formation of the Al₂O₃ films 55 and 60, these are not left on the Cu wirings, a via hole can be easily formed.

Figure 7:
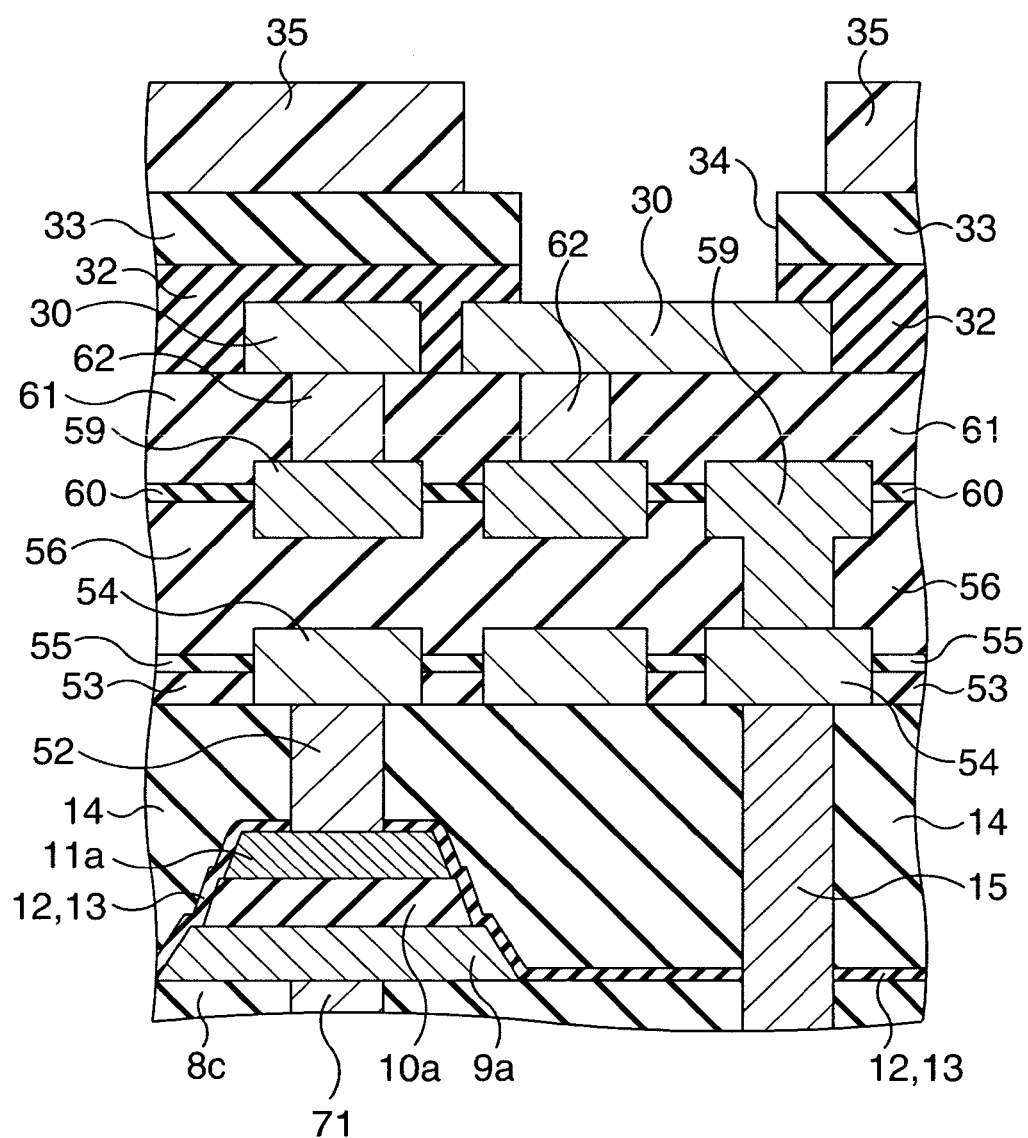
FIG. 7 is a cross sectional view illustrating an example of modification according to the fourth embodiment.

Further, while in the fourth embodiment, the structure of the ferroelectric capacitor is a planer-type, a stack-type structure as shown in FIG. 7 may be employed. In this case, the via plug 71 connected to the bottom electrode 9a is formed through the SiN film 8c or the like, which is a substitute of the Al₂O₃ film 8b. Further, while in FIG. 7 the ferroelectric capacitor has steps at the side surfaces thereof, such steps will not be formed in the case of utilizing a high-temperature collective etching technique. Furthermore, the utilization of a high-temperature collective etching technique enables miniaturization.

Fifth Embodiment

Next, the fifth embodiment of the present invention will be described. Here, for convenience, the cross sectional structure of the semiconductor device will be described along with the fabrication method of the same. FIGS. 8A to 8H are cross sectional views illustrating a method for fabricating a ferroelectric memory (semiconductor device) according to the fifth embodiment of the present invention, in the order of processes.

Figure 8A:
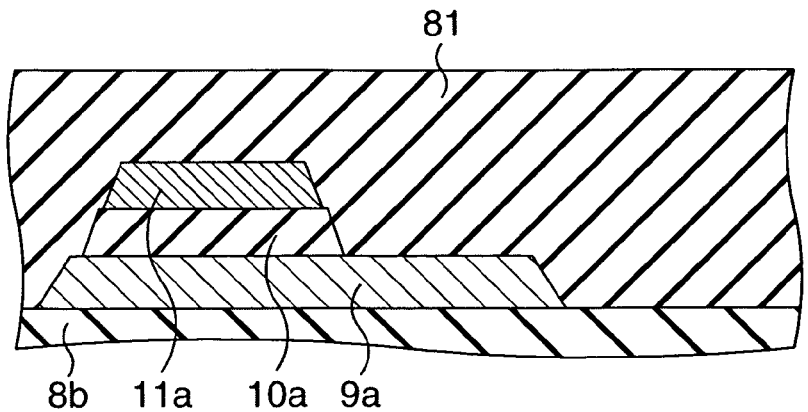
FIGS. 8A to 8H are cross sectional views illustrating, in the order of processes, a fabricating method of a ferroelectric memory according to a fifth embodiment of the present invention.

In the fifth embodiment, first, as shown in FIG. 8A, similarly to the first embodiment, a series of processes until the formation of a ferroelectric capacitor are performed. However, the formation of an Al₂O₃ film 12 is omitted. After the formation of the ferroelectric capacitor, a silicon oxide film 81 is formed over the entire surface.

Figure 8B:
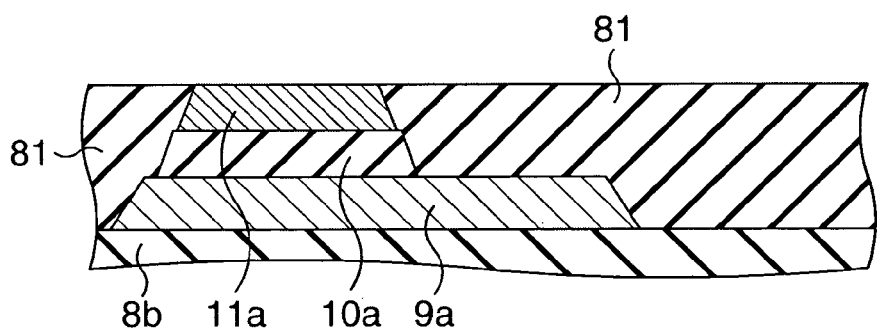

Next, as shown in FIG. 8B, the silicon oxide film 81 is polished by CMP, until the top electrode 11a is exposed. Namely, CMP is applied to the silicon oxide film 81 by using the top electrode 11a as a stopper film.

Figure 8C:
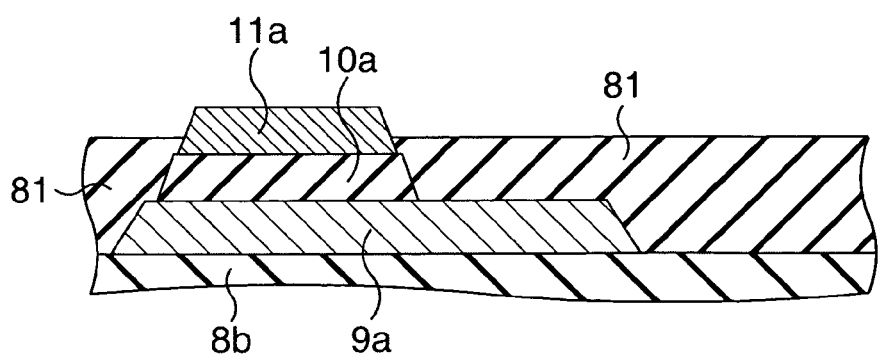

Then, as shown in FIG. 8C, the silicon oxide film 81 is etched back. As a result, the surface of the silicon oxide film 81 becomes lower than the surface of the top electrode 11a.

Figure 8D:
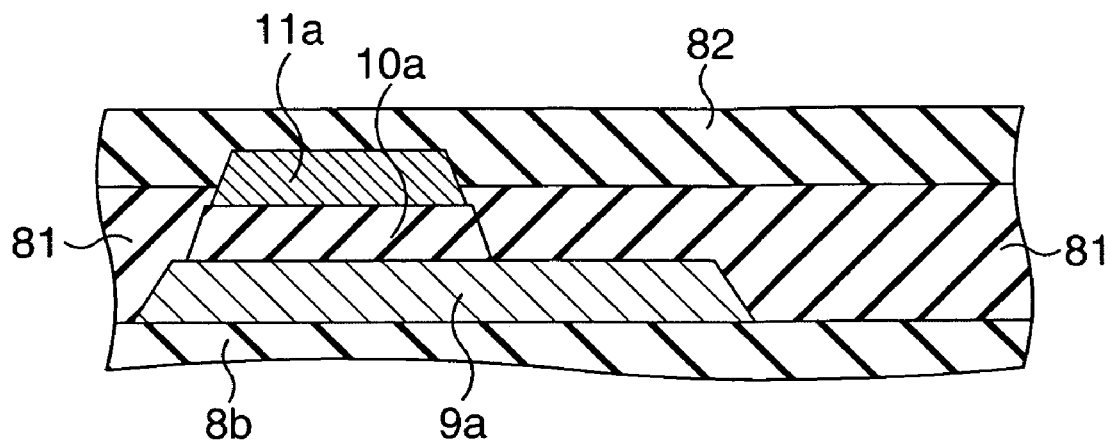

Then, as shown in FIG. 8D, an $Al_2O_3$ film 82 covering the top electrode 11a is formed over the entire surface as a protective film. It is preferable that annealing and a plasma process using $N_2O$ gas or the like are performed prior to the formation of the $Al_2O_3$ film 82. By the annealing, damages in the capacitive insulating film 10a are alleviated, and by the plasma process, the surface of the silicon oxide film 81 is nitrided to some degree, thus suppressing intrusion of moisture to the inside thereof.

Figure 8E:
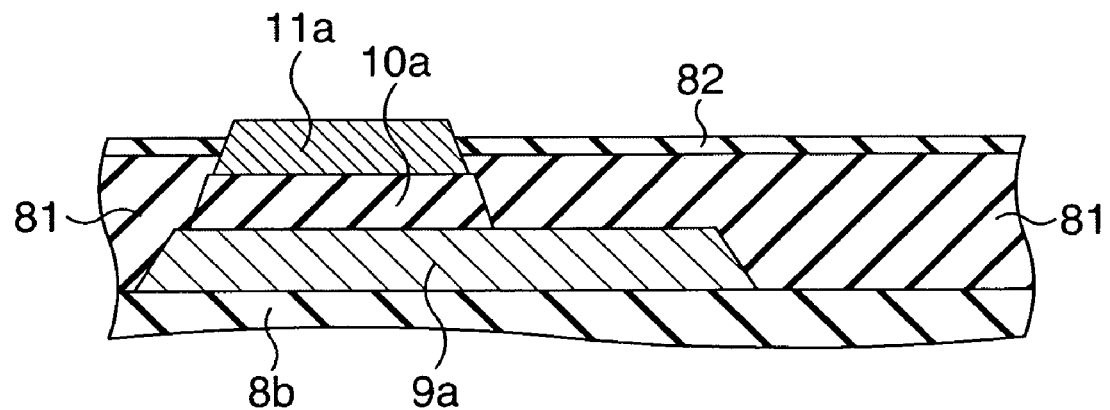

Then, as shown in FIG. 8E, the $Al_2O_3$ film 82 is polished by CMP until the top electrode 11a is exposed. Namely, CMP is applied to the $Al_2O_3$ film 82 by utilizing the top electrode 11a as a stopper film. While in FIG. 8E there is illustrated a state where the surface of the $Al_2O_3$ film 82 is lower than the surface of the top electrode 11a, the surface of the $Al_2O_3$ film 82 may be at the same height as the surface of the top electrode 11a.

Figure 8F:
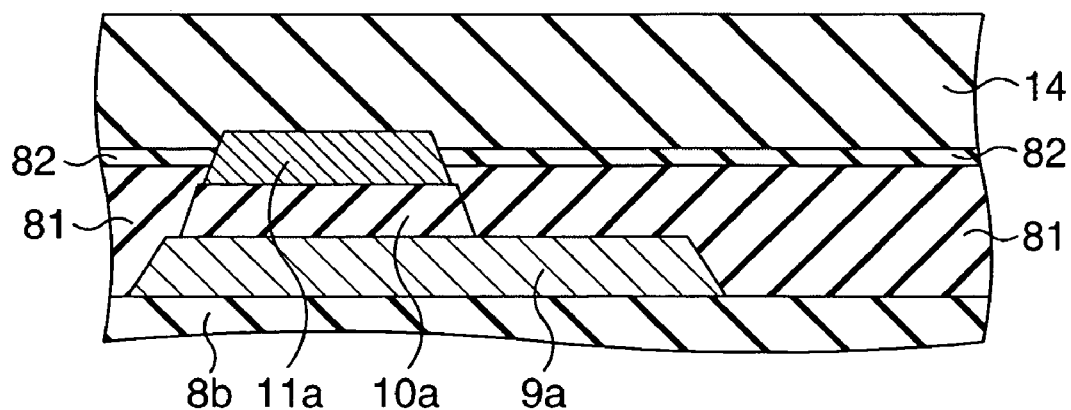

Next, as shown in FIG. 8F, the interlayer insulation film 14 is formed over the entire surface. Then, the interlayer insulation film 14 is flattened by a CMP method.

Figure 8G:
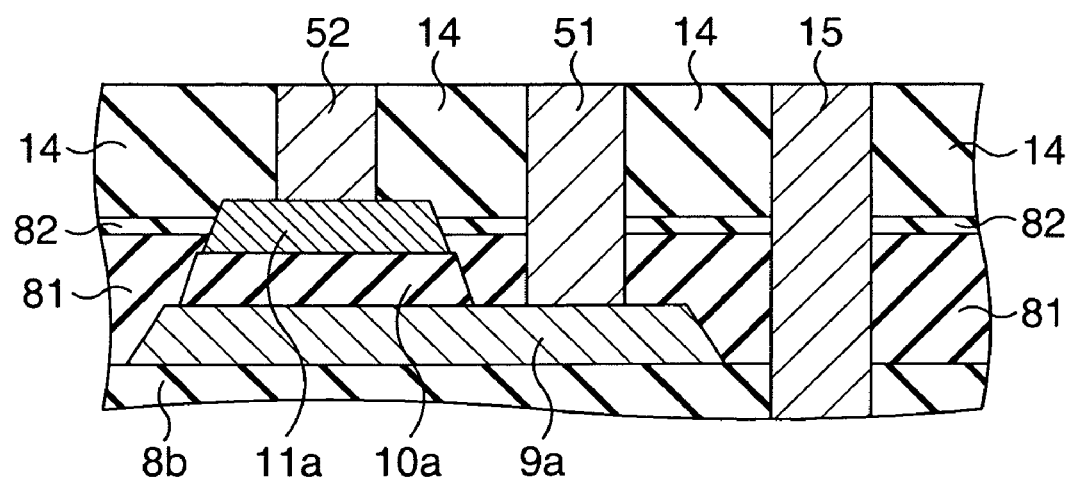

Subsequently, as shown in FIG. 8G, similarly to the fourth embodiment, the W plug 15, the via plug 51 and the via plug 52 are formed.

Figure 8H:
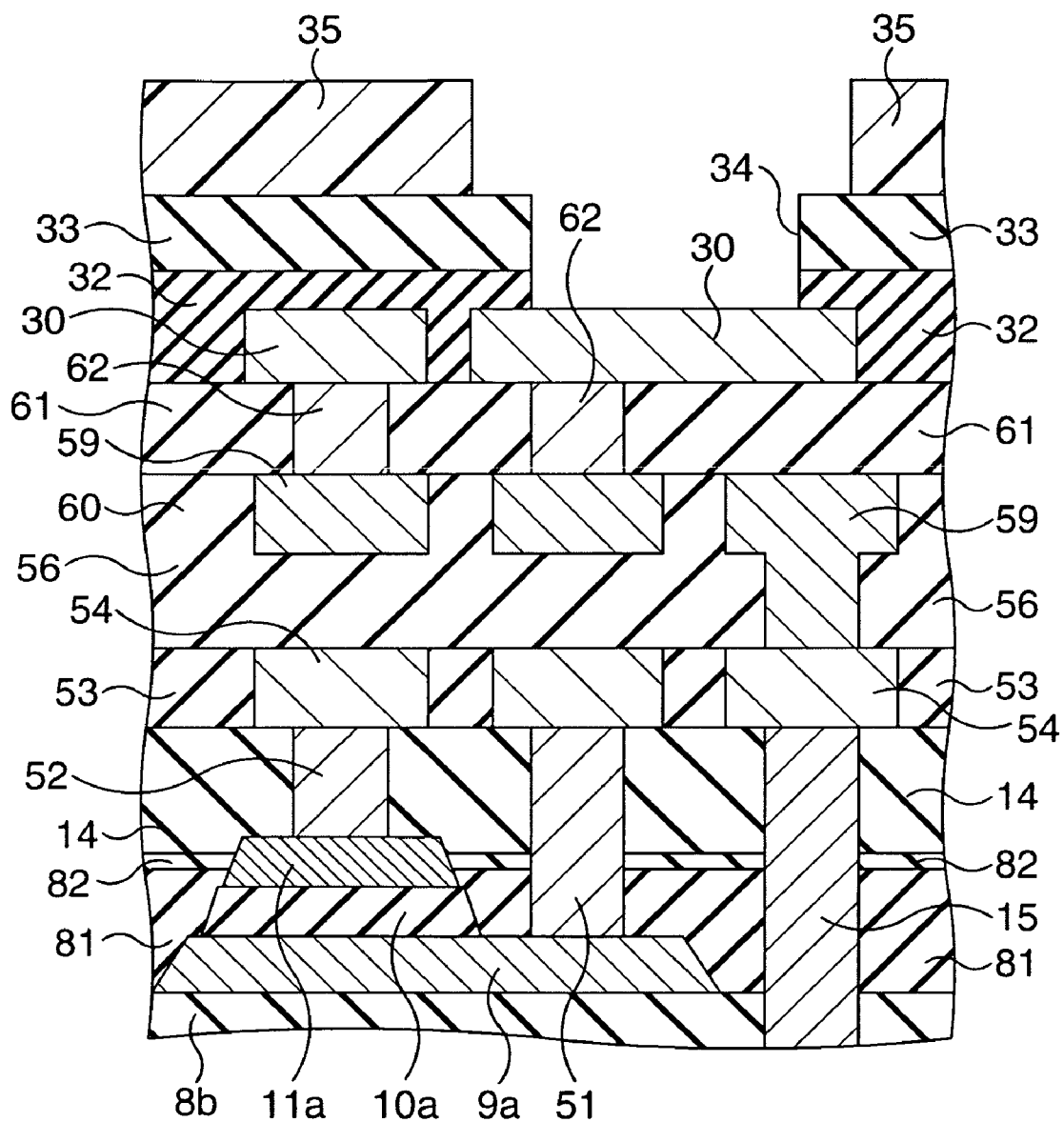

Then, as shown in FIG. 8H, similarly to the fourth embodiment, the silicon oxide film 53 and the Cu wiring 54 are formed by a damascene method. Next, the silicon oxide film 56 is formed over the entire surface and then the silicon oxide film 56 is flattened. Next, the wiring trench and the via hole are formed in the silicon oxide film 56, and the Cu material 59 is formed such that it is embedded therein. Then, similarly to the forth embodiment, the formation of the silicon oxide film 61 and the subsequent processes are performed.

With the present embodiment, since the $Al_2O_3$ film 82 (protective film) is formed around the top electrode 11a, it is possible to suppress degradation of the capacitor insulation film 10a, similarly to the case of forming a protective film around the wirings. Furthermore, the $Al_2O_3$ film 82 does not exist on the top electrode 11a when the via hole reaching the top electrode 11a is formed, which further enhances the accuracy of the via hole.

Figure 9:
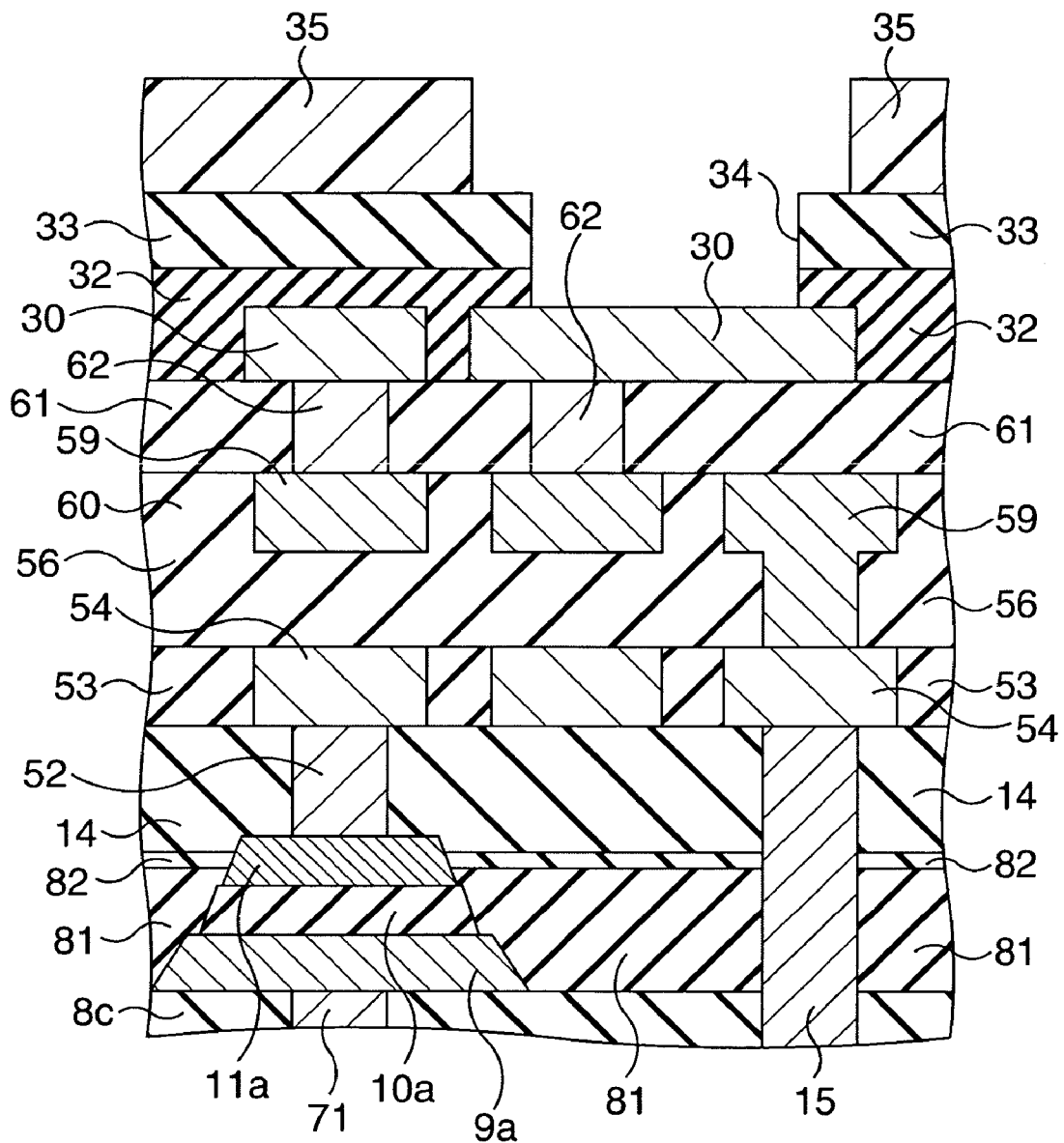
FIG. 9 is a cross sectional view illustrating an example of modification according to the fifth embodiment.

Further, while in the fifth embodiment the structure of the ferroelectric capacitor is a planer-type, a stack-type structure as shown in FIG. 9 may be employed. In this case, the via plug 71 connected to the bottom electrode 9a is formed through the SiN film 8c or the like, which is a substitute of the $Al_2O_3$ film 8b. Further, while in FIG. 9 the ferroelectric capacitor has steps at the side surfaces thereof, such steps will not be formed in the case of utilizing a high-temperature collective etching technique. Furthermore, the utilization of a high-temperature collective etching technique enables miniaturization.

Sixth Embodiment

Figure 10A:
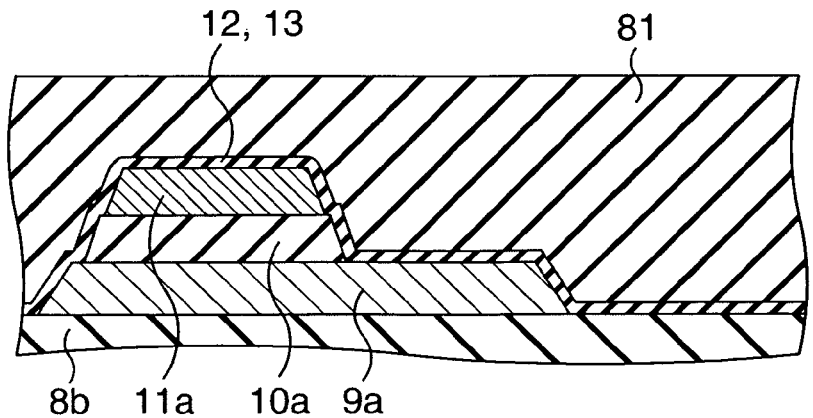
FIGS. 10A to 10C are cross sectional views illustrating, in the order of processes, a fabricating method of a ferroelectric memory according to a sixth embodiment of the present invention.
Figure 10B:
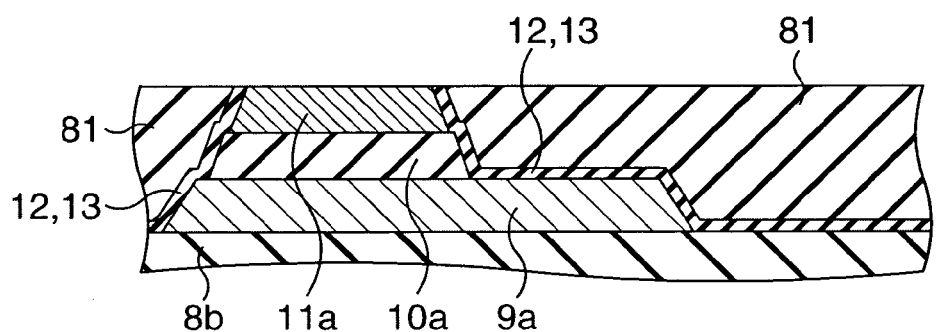
Figure 10C:
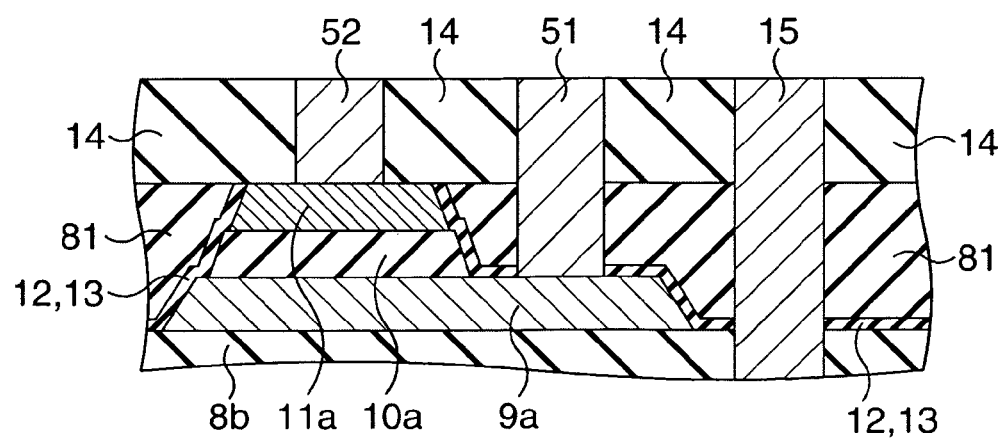

Next, the sixth embodiment of the present invention will be described. Here, for convenience, the cross sectional structure of the semiconductor device will be described along with the fabrication method of the same. FIGS. 10A to 10C are cross sectional views illustrating a method for fabricating a ferroelectric memory (semiconductor device) according to the sixth embodiment of the present invention, in the order of processes.

In the sixth embodiment, first, as shown in FIG. 10A, similarly to the first embodiment, a series of processes until the formation of an $Al_2O_3$ film 13 are performed. Next, similarly to the fifth embodiment, the silicon oxide film 81 is formed.

Next, as shown in FIG. 10B, the silicon oxide film 81 and the $Al_2O_3$ films 12 and 13 are polished by CMP, until the top electrode 11a is exposed. Namely, CMP is applied to the silicon oxide film 81 and the $Al_2O_3$ films 12 and 13 by using the top electrode 11a as a stopper film.

Next, as shown in FIG. 10C, the interlayer insulation film 14 is formed over the entire surface. Then, the interlayer insulation film 14 is flattened by a CMP method. Then, similarly to the fourth embodiment, the W plug 15, the via plug 51 and the via plug 52 are formed.

With the present embodiment, the $Al_2O_3$ films 12 and 13 do not exist on the top electrode 11a when the via hole reaching the top electrode 11a is formed, which further enhances the accuracy of the via hole.

Figure 18:
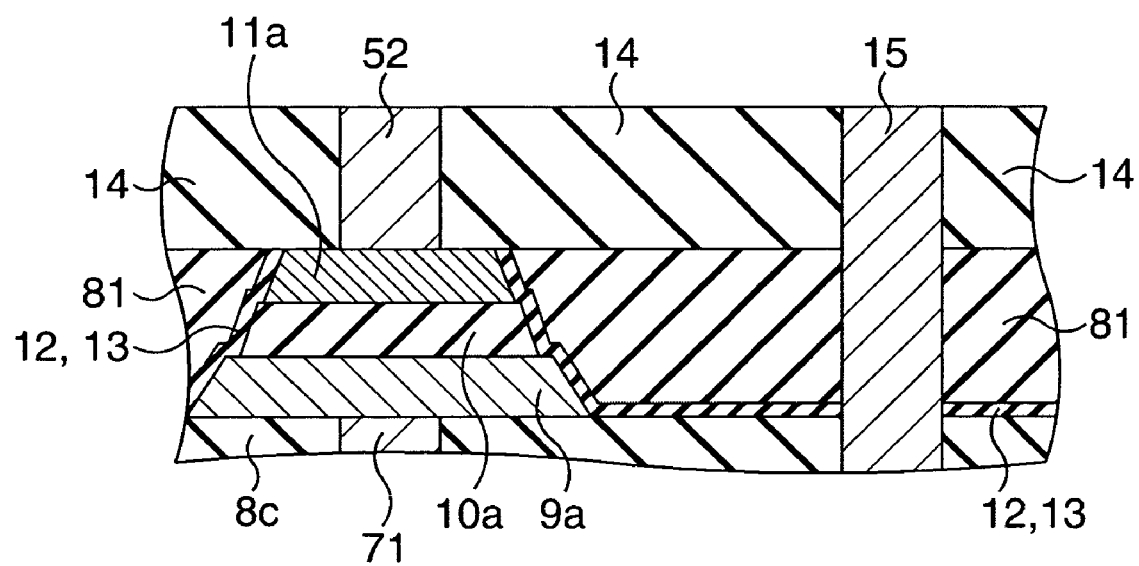
FIG. 18 is a cross sectional view illustrating an example of modification according to the sixth embodiment.

Further, in the sixth embodiment, a stack-type structure as shown in FIG. 18 may be employed. In this case, the via plug 71 connected to the bottom electrode 9a is formed through the SiN film 8c or the like, which is a substitute of the $Al_2O_3$ film 8b. Further, while in FIG. 18 the ferroelectric capacitor has steps at the side surfaces thereof, such steps will not be formed in the case of utilizing a high-temperature collective etching technique. Furthermore, the utilization of a high-temperature collective etching technique enables miniaturization.

Seventh Embodiment

Figure 15:
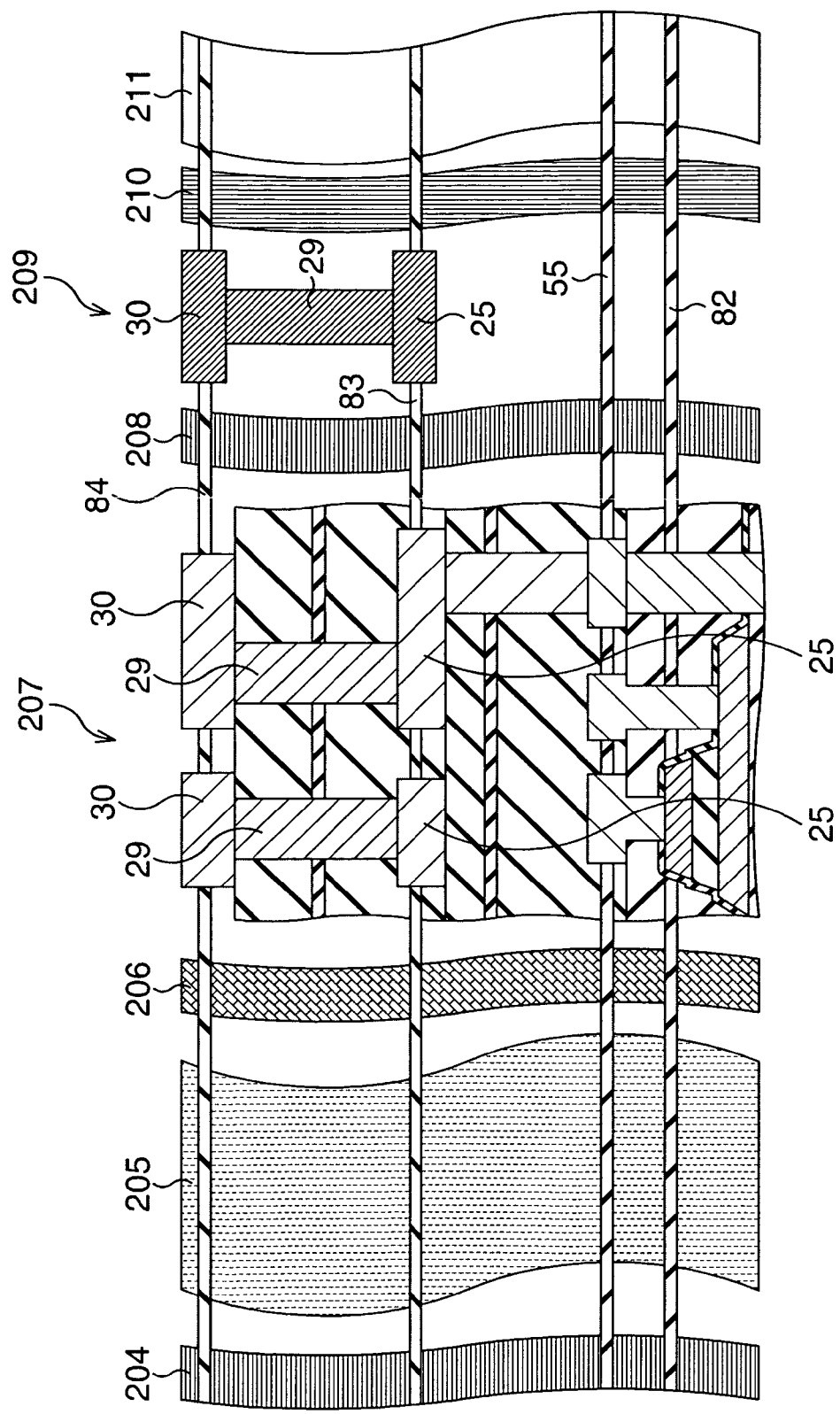
FIG. 15 is a view illustrating a cross sectional layout of a semiconductor device according to a seventh embodiment of the present invention.
Figure 16:
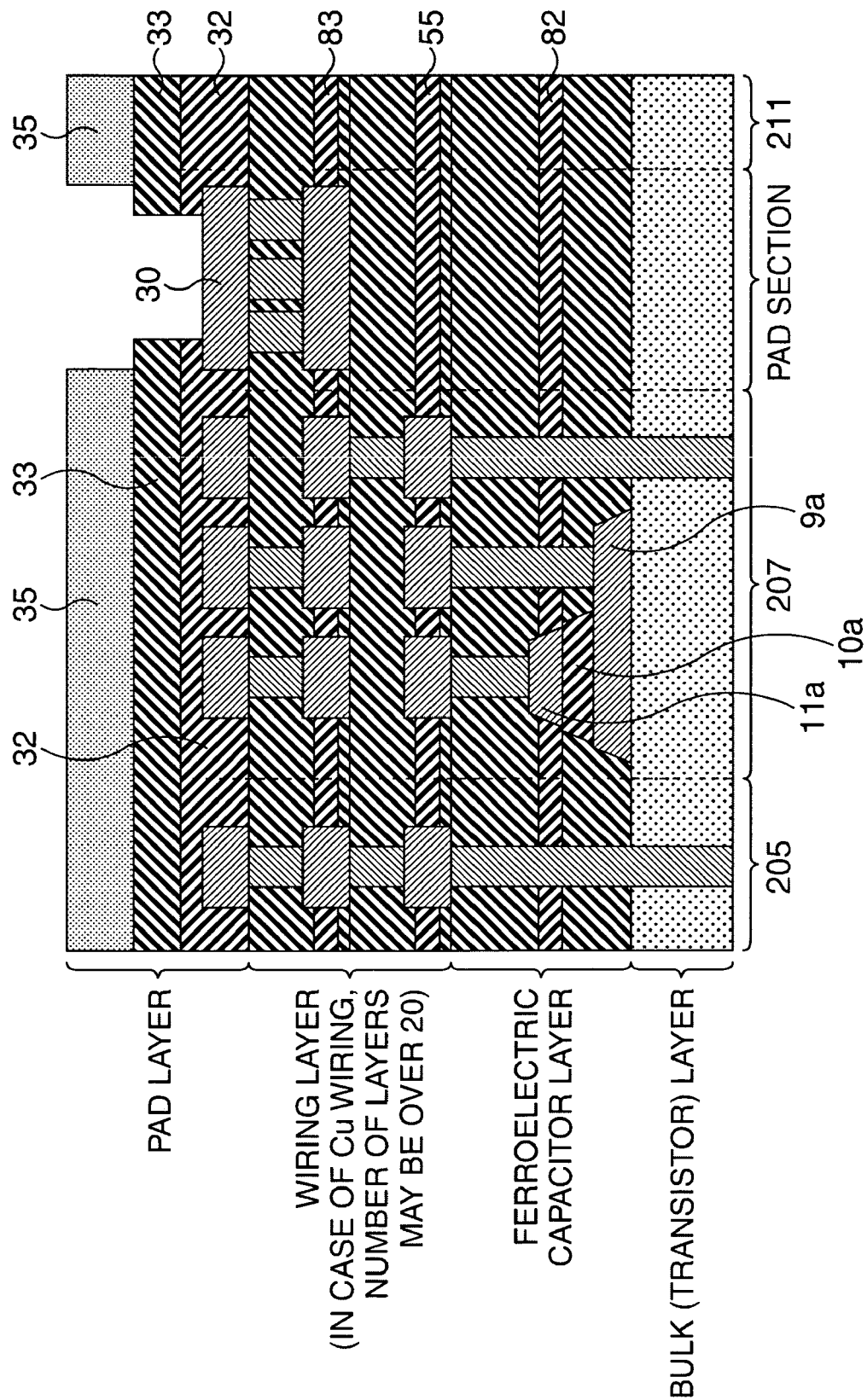
FIG. 16 is a cross sectional view illustrating a semiconductor device according to the seventh embodiment of the present invention.

Next, the seventh embodiment of the present invention will be described. In the seventh embodiment, as shown in FIG. 15 and FIG. 16, two or more $Al_2O_3$ films are formed. Namely, the $Al_2O_3$ films 82 and 55 are formed and further $Al_2O_3$ films 83 and 84 are formed above them.

Further, in any of the embodiments, for example, a $PbZr_{1-x}Ti_xO_3$ film, a $Pb_{1-x}La_xZr_{1-y}Ti_yO_3$ film, a $SrBi_2(Ta_xNb_{1-x})_2O_9$ film, a $Bi_4Ti_2O_{12}$ film or the like may be employed, as a ferroelectric film. Further, as the wiring material, Al—Cu alloys or the like may be employed, as well as Al and Cu.

Patent Document 6 (Japanese Patent Application Laid-open No. 2003-289074) describes flattening an interlayer insulation film embedded among wirings with the aim of forming wirings with high aspect ratios. However, there is no description about forming, on the wirings, a film for preventing moisture diffusion. Further, this interlayer insulation film is easy to process, and therefore it is not necessary to flatten the interlayer insulation film only with the aim of easily forming an opening.

With the present invention, the ferroelectric capacitor can be protected by the insulation film. Further, since the insulation film is formed such that the surfaces of the wirings or the top electrode are exposed, openings can be easily formed through an insulation film covering the wirings or the top electrode.

When the insulation film for suppressing intrusion of at least moisture is formed over the ferroelectric memory cell section, it is possible to easily form openings and also reduce the amount of moisture or hydrogen intruded from above the ferroelectric memory section. This can prevent degradation of the characteristics of the ferroelectric capacitor due to intrusion of moisture or hydrogen.

When the insulation film for suppressing intrusion of at least moisture is formed over the ferroelectric memory cell section and the peripheral circuit section, it is possible to easily form openings, reduce the amount of moisture or hydrogen intruded from above the ferroelectric memory cell section, and also reduce the amount of moisture or hydrogen intruded from above the peripheral circuit section. Namely, this can reduce the total amount of moisture or hydrogen intruded from above the chip. Accordingly, this can prevent degradation of the characteristics of the ferroelectric capacitor due to intrusion of moisture or hydrogen.

When the insulation film for suppressing intrusion of at least moisture is formed over the ferroelectric memory cell section, the peripheral circuit section and the pad section, it is possible to easily form openings, reduce the amount of moisture or hydrogen intruded from above the ferroelectric memory cell section and the peripheral circuit section, and also reduce the amount of section or hydrogen intruded from above the pad section. Namely, this can reduce the total amount of moisture or hydrogen intruded from above the chip. This can prevent degradation of the characteristics of the ferroelectric capacitor due to intrusion of moisture or hydrogen.

When the insulation film for suppressing intrusion of at least moisture is formed over the ferroelectric memory cell section, the peripheral circuit section, the pad section and over the entire substrate surface, it is possible to easily form openings, reduce the amount of moisture or hydrogen intruded from above the ferroelectric memory cell section, the peripheral circuit section and the pad section, and further reduce the amount of moisture or hydrogen intruded from above the other section. Namely, this can reduce the total amount of moisture or hydrogen intruded from above the chip. This can prevent degradation of the characteristics of the ferroelectric capacitor due to intrusion of moisture or hydrogen.

Further, when two or more insulation films for suppressing intrusion of moisture are formed, the amount of moisture or hydrogen intruded from above can be drastically reduced.

What is claimed is:

1. A semiconductor device comprising:
   a ferroelectric capacitor having an electrode;
   a first insulation film covering said ferroelectric capacitor, in said first insulation film a hole reaching the electrode of said ferroelectric capacitor being formed, and all of a top surface of said first insulation film being at a higher position than a top surface of said ferroelectric capacitor;
   a second insulation film suppressing intrusion of hydrogen or moisture into said ferroelectric capacitor formed above said first insulation film, said second insulation film including a gap; and
   a wiring layer including a wiring formed in the gap in said second insulation film, the surface of the wiring being exposed from said second insulation film.

2. The semiconductor device according to claim 1, wherein said wiring layer includes a conductive barrier film formed on the surface of the wiring.

3. The semiconductor device according to claim 2, wherein the conductive barrier film is a metal nitride film.

4. The semiconductor device according to claim 1, wherein the wiring contains at least one of Al and Cu.

5. A semiconductor device comprising:
   a ferroelectric memory cell section including a plurality of ferroelectric memories, each including a ferroelectric capacitor having an electrode; a first insulation film covering said ferroelectric capacitor, in said first insulation film a hole reaching the electrode of said ferroelectric capacitor being formed, and all of a top surface of said first insulation film being at a higher position than a top surface of said ferroelectric capacitor; a second insulation film suppressing intrusion of hydrogen or moisture into the ferroelectric capacitor formed above said first insulation film, the second insulation film including a gap; and a wiring layer including a wiring formed in the gap in the second insulation film, the surface of the wiring being exposed from the second insulation film; and
   a peripheral circuit section, the insulation film being formed at least over said ferroelectric memory cell section.

6. A semiconductor device comprising:
   a ferroelectric capacitor having a top electrode; and
   an insulation film suppressing intrusion of hydrogen or moisture into said ferroelectric capacitor, said insulation film being formed below the surface of the top electrode, and the surface of the top electrode being exposed from said insulation film,
   wherein said top electrode is a capacitor plate electrode.

7. The semiconductor device according to claim 6, wherein said insulation film is formed at the side portion of the top electrode.

8. The semiconductor device according to claim 6, wherein said insulation film covers the side surface of said ferroelectric capacitor.

9. The semiconductor device according to claim 1, wherein said insulation film is a film selected from a group consisting of an oxide film, a nitride film and a carbide film.

10. A semiconductor device comprising:
    a ferroelectric memory cell section including a plurality of ferroelectric memories, each including a ferroelectric capacitor having a top electrode; and an insulation film suppressing intrusion of hydrogen or moisture into the ferroelectric capacitor, the insulation film being formed below the surface of the top electrode, and the surface of the top electrode being exposed from the insulation film; and
    a peripheral circuit section, the insulation film being formed at least over said ferroelectric memory cell section,
    wherein said top electrode is a capacitor plate electrode.

11. A fabricating method of a semiconductor device comprising the steps of:
    forming a ferroelectric capacitor having an electrode;
    forming a first insulation film covering said ferroelectric capacitor, in the first insulation film a hole reaching the electrode of the ferroelectric capacitor being formed, and all of a top surface of the first insulation film being at a higher position than a top surface of the ferroelectric capacitor; and
    forming a wiring layer including a wiring connected to the electrode of the ferroelectric capacitor, said step of forming the wiring layer including the step of forming a second insulation film suppressing intrusion of hydrogen or moisture into the ferroelectric capacitor in a gap of the wiring such that the surface of the wiring is exposed.

12. The fabricating method of a semiconductor device according to claim 11, wherein said step of forming said wiring layer includes the step of forming a conductive barrier film on the surface of the wiring.

13. The fabricating method of a semiconductor device according to claim 12, wherein a metal nitride film is formed as the conductive barrier film.

14. The fabricating method of a semiconductor device according to claim 11, wherein a wiring containing Al is formed as the wiring.

15. The fabricating method of a semiconductor device according to claim 11, wherein said step of forming said wiring layer includes the step of forming a wiring containing Cu by a damascene method.

16. The fabricating method of a semiconductor device according to claim 12, further comprising the step of flattening the insulation film by a CMP process while utilizing the conductive barrier film as a stopper.

* * * * *